(12) United States Patent
Kim et al.

(10) Patent No.: US 12,568,867 B2
(45) Date of Patent: Mar. 3, 2026

(54) SEMICONDUCTOR PACKAGE INCLUDING UNDER-BUMP PROTECTION PATTERNS AND METHOD OF MANUFACTURING THE SEMICONDUCTOR PACKAGE

(71) Applicant: Samsung Electronics Co., Ltd., Suwon-si (KR)

(72) Inventors: Minjung Kim, Suwon-si (KR); Jongbeom Park, Suwon-si (KR); Ji-Hyun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 497 days.

(21) Appl. No.: 17/977,167

(22) Filed: Oct. 31, 2022

(65) Prior Publication Data

US 2023/0307334 A1     Sep. 28, 2023

(30) Foreign Application Priority Data

Mar. 25, 2022     (KR) ........................ 10-2022-0037643

(51) Int. Cl.
H01L 23/498 (2006.01)
H01L 21/48 (2006.01)
(Continued)

(52) U.S. Cl.
CPC .... H01L 23/49816 (2013.01); H01L 21/4857 (2013.01); H01L 21/486 (2013.01); (Continued)

(58) Field of Classification Search
CPC ......... H01L 23/49816; H01L 23/49833; H01L 23/5386; H01L 2224/08235; H01L 2224/16227; H01L 2224/48117; H01L 24/08; H01L 24/16; H01L 24/48; H01L 24/13; H01L 23/5383; H01L 23/3128; H01L 23/49838; H01L 23/49822; H01L 21/4857
See application file for complete search history.

(56) References Cited

U.S. PATENT DOCUMENTS

| | | | |
|---|---|---|---|
| 6,734,568 B2 * | 5/2004 | Matsuo | ............... H01L 25/0657 |
| | | | 257/E21.705 |
| 7,095,116 B1 | 8/2006 | Kelkar et al. | |
| 7,939,948 B2 | 5/2011 | Tang et al. | |
| 8,659,155 B2 | 2/2014 | Cheng et al. | |
| 9,269,682 B2 | 2/2016 | Yu et al. | |

(Continued)

FOREIGN PATENT DOCUMENTS

| | | |
|---|---|---|
| JP | 2006-049427 A | 2/2006 |
| JP | 2021-180205 A | 11/2021 |

(Continued)

*Primary Examiner* — Khiem D Nguyen
(74) *Attorney, Agent, or Firm* — Muir Patent Law, PLLC

(57)     ABSTRACT

A method of manufacturing a semiconductor package may include providing a semiconductor chip, forming redistribution patterns, which are provided on a top surface of the semiconductor chip and are electrically connected to the semiconductor chip, forming a protection layer to cover top surfaces of the redistribution patterns, forming under-bump protection patterns on the protection layer, and forming under-bump patterns, which are provided on the protection layer and are electrically connected to the redistribution patterns. The under-bump protection patterns may be spaced apart from each other.

20 Claims, 19 Drawing Sheets

(51) Int. Cl.

| | |
|---|---|
| *H01L 23/00* | (2006.01) |
| *H01L 23/538* | (2006.01) |
| *H01L 25/10* | (2006.01) |

(52) U.S. Cl.

CPC .. *H01L 23/49822* (2013.01); *H01L 23/49833* (2013.01); *H01L 23/49838* (2013.01); *H01L 23/49894* (2013.01); *H01L 23/5383* (2013.01); *H01L 23/5386* (2013.01); *H01L 24/08* (2013.01); *H01L 25/105* (2013.01); *H01L 24/16* (2013.01); *H01L 24/48* (2013.01); *H01L 2224/08235* (2013.01); *H01L 2224/16227* (2013.01); *H01L 2224/48227* (2013.01); *H01L 2225/1023* (2013.01); *H01L 2225/1041* (2013.01); *H01L 2225/1058* (2013.01); *H01L 2225/1094* (2013.01); *H01L 2924/1431* (2013.01); *H01L 2924/1433* (2013.01); *H01L 2924/1434* (2013.01); *H01L 2924/15311* (2013.01)

(56) References Cited

U.S. PATENT DOCUMENTS

| | | | | |
|---|---|---|---|---|
| 9,318,457 | B2 * | 4/2016 | Topacio | ................. H01L 24/13 |
| 2007/0139068 | A1 * | 6/2007 | Behzad | ................. H01L 24/10 |
| | | | | 257/E23.021 |
| 2011/0254159 | A1 * | 10/2011 | Hwang | ................. H01L 24/05 |
| | | | | 438/615 |
| 2016/0020186 | A1 * | 1/2016 | Chen | ................. H01L 24/05 |
| | | | | 257/737 |
| 2021/0005564 | A1 | 1/2021 | Chang et al. | |
| 2021/0028096 | A1 * | 1/2021 | Kim | ................. H01L 24/20 |
| 2021/0351134 | A1 * | 11/2021 | Kao | ................. H01L 21/76883 |

FOREIGN PATENT DOCUMENTS

| | | | |
|---|---|---|---|
| KR | 10-2002-0094472 | A | 12/2002 |
| KR | 10-1208758 | B1 | 12/2012 |
| KR | 10-2013-0139540 | A | 12/2013 |
| KR | 10-2022-0020716 | A | 2/2022 |

* cited by examiner

SEMICONDUCTOR PACKAGE INCLUDING UNDER-BUMP PROTECTION PATTERNS AND METHOD OF MANUFACTURING THE SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2022-0037643, filed on Mar. 25, 2022, in the Korean Intellectual Property Office, the entire contents of which are hereby incorporated by reference.

BACKGROUND OF THE INVENTION

The present disclosure relates to a semiconductor package, and in particular, a semiconductor package including a redistribution substrate and a method of manufacturing the same.

A semiconductor package includes a semiconductor chip that is provided to be easily used as a part of an electronic product. In general, the semiconductor package includes a printed circuit board (PCB) and a semiconductor chip, which is mounted on the PCB and is electrically connected to the PCB using bonding wires or bumps. With development of the electronic industry, various studies are being conducted to realize a highly-reliable, highly-integrated, and small-sized semiconductor package.

SUMMARY

An embodiment of the inventive concept provides a semiconductor package with improved reliability and durability.

According to an embodiment of the inventive concept, a method of manufacturing a semiconductor package may include providing a semiconductor chip, forming redistribution patterns, which are provided on a top surface of the semiconductor chip and are electrically connected to the semiconductor chip, forming a protection layer to cover top surfaces of the redistribution patterns, forming under-bump protection patterns on the protection layer, and forming under-bump patterns, which are provided on the protection layer and are electrically connected to the redistribution patterns. The under-bump protection patterns may be spaced apart from each other.

According to an embodiment of the inventive concept, a method of manufacturing a semiconductor package may include providing a semiconductor chip including a chip pad, forming a redistribution substrate, which includes an insulating layer, a seed pattern, and redistribution patterns, on a top surface of the semiconductor chip, the redistribution patterns being electrically connected to the chip pad, forming a protection layer to cover top surfaces of the redistribution patterns, forming under-bump protection patterns, each of which has a closed loop shape with an opening, on the protection layer, the under-bump protection patterns exposing at least a portion of a top surface of the protection layer between outer side surfaces thereof, forming an under-bump seed layer on the protection layer and the under-bump protection patterns to cover the top surface of the protection layer, top surfaces of the under-bump protection patterns, and bottom and side surfaces of the openings, forming under-bump patterns, which are electrically connected to the redistribution patterns, in the openings of the under-bump protection patterns, etching the under-bump seed layer to form under-bump seed patterns, which are provided between the under-bump patterns and the under-bump protection patterns, between the under-bump patterns and the protection layer, and between the under-bump patterns and the redistribution patterns, and forming solder balls on the under-bump patterns. The under-bump protection patterns may be spaced apart from each other.

According to an embodiment of the inventive concept, a semiconductor package may include a semiconductor chip, redistribution patterns, which are provided on a bottom surface of the semiconductor chip and are electrically connected to the semiconductor chip, a protection layer covering bottom surfaces of the redistribution patterns, under-bump protection patterns, which are provided on a bottom surface of the protection layer and have a closed loop shape, and under-bump patterns electrically connected to the redistribution patterns in the under-bump protection patterns and on the protection layer. The under-bump protection patterns may be spaced apart from each other.

BRIEF DESCRIPTION OF THE DRAWINGS

FIG. 7 is a cross-sectional view illustrating a semiconductor module according to an embodiment of the inventive concept.

DETAILED DESCRIPTION

Figure 1:
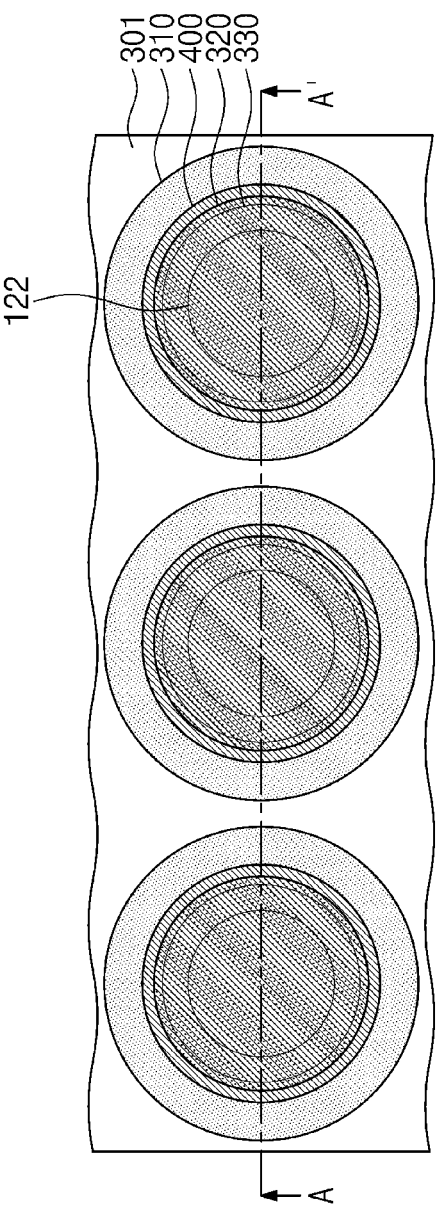
FIG. 1 is a plan view illustrating a semiconductor package according to an embodiment of the inventive concept.

Example embodiments of the inventive concepts will now be described more fully with reference to the accompanying drawings, in which example embodiments are shown. Like reference numerals in the drawings denote like elements, and thus their duplicated descriptions will be omitted.

Figure 2:
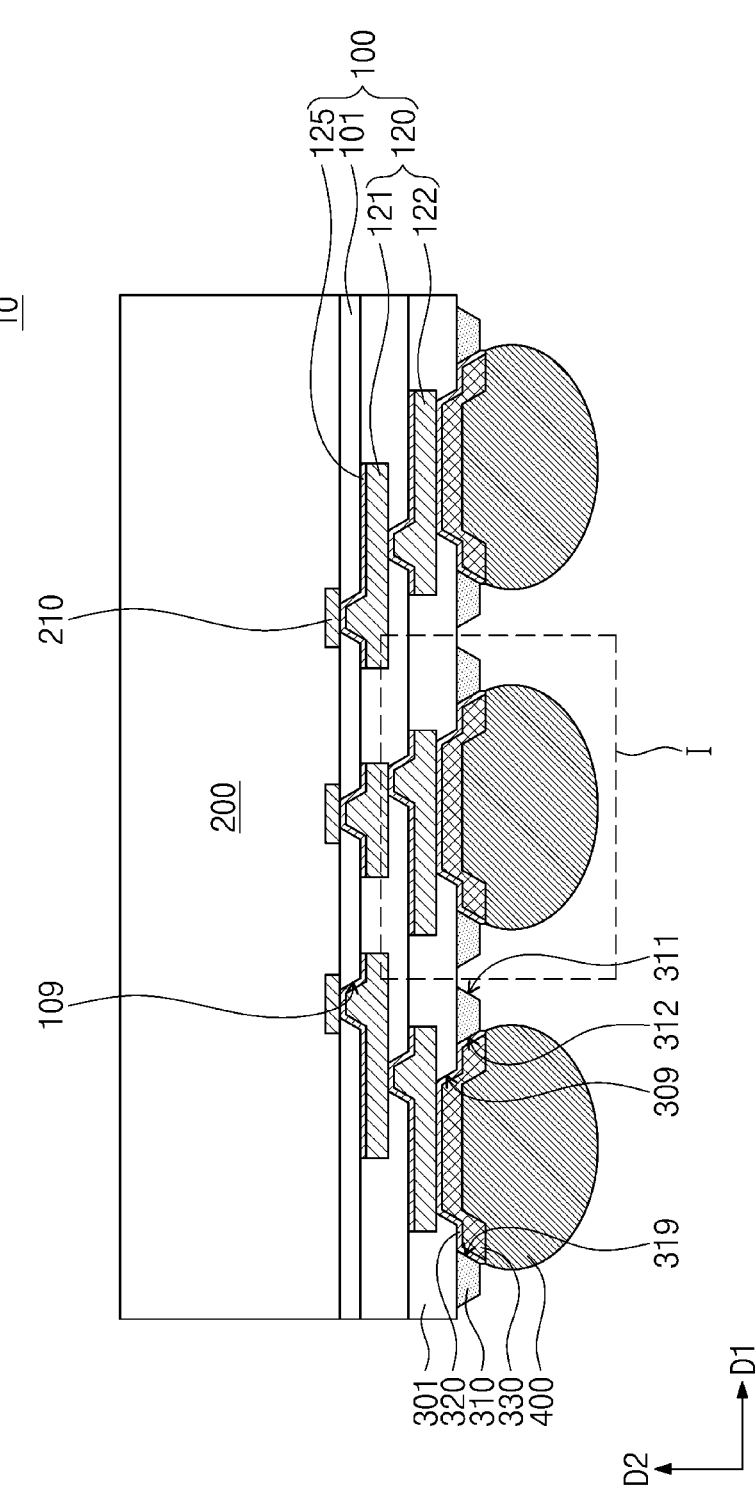
FIG. 2 is a cross-sectional view taken along a line A-A' of FIG. 1.
Figure 3A:
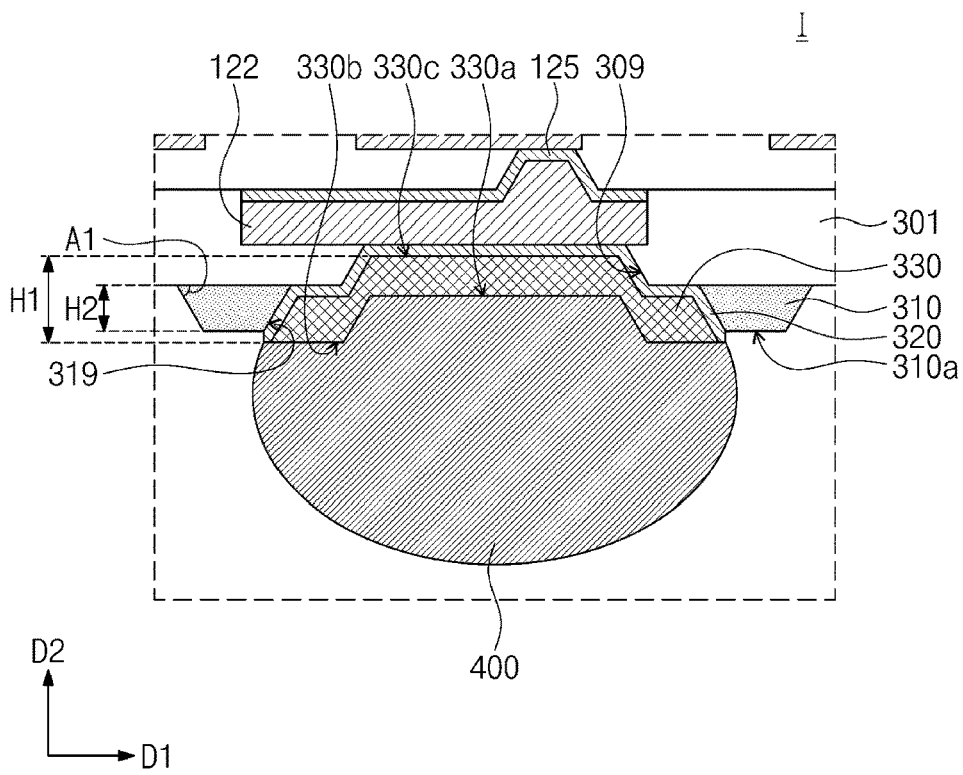
FIG. 3A is an enlarged sectional view illustrating a portion 'I' of FIG. 2.

FIG. 1 is an enlarged plan view illustrating a portion of a semiconductor package according to an embodiment of the inventive concept. FIG. 2 is a cross-sectional view taken along a line A-A' of FIG. 1. FIG. 3A is an enlarged sectional view illustrating a portion 'I' of FIG. 2.

Referring to FIGS. 1, 2, and 3A, a semiconductor package 10 may include a first redistribution substrate 100, a semiconductor chip 200, a protection layer 301, under-bump protection patterns 310, under-bump seed patterns 320, under-bump patterns 330, and solder balls 400.

The semiconductor chip 200 may be mounted on a top surface of the first redistribution substrate 100. The semiconductor chip 200 may be one of a logic chip, a buffer chip, and a memory chip. In an embodiment, the semiconductor chip 200 may be the logic chip. The logic chip may include or may be an application specific integrated circuit (ASIC) chip and/or an application processor (AP) chip. The ASIC chip may include application specific integrated circuit (ASIC). In another embodiment, the semiconductor chip 200 may include or may be a central processing unit (CPU) or a graphic processing unit (GPU). The memory chip may be a high bandwidth memory (HBM) chip.

The semiconductor chip 200 may have a top surface and a bottom surface, which are opposite to each other. The bottom surface of the semiconductor chip 200 may be in contact with the first redistribution substrate 100. The semiconductor chip 200 may include integrated circuits and chip pads 210. The integrated circuits may be provided in the semiconductor chip 200. The chip pads 210 may be provided on a bottom surface of the semiconductor chip 200 and may be coupled (e.g., electrically connected) to the integrated circuits in the semiconductor chip 200. An electric connection to the semiconductor chip 200 may mean an electric connection to the integrated circuits through the chip pads 210 of the semiconductor chip 200. A first direction D1 may be parallel to a top surface of the semiconductor chip 200. A second direction D2 may be substantially perpendicular to the top surface of the semiconductor chip 200.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Other words used to describe the relationship between elements should be interpreted in a like fashion (e.g., "between" versus "directly between," "adjacent" versus "directly adjacent," etc.).

As used herein, components described as being "electrically connected" are configured such that an electrical signal can be transferred from one component to the other (although such electrical signal may be attenuated in strength as it transferred and may be selectively transferred).

Terms such as "same," "equal," "planar," "coplanar," or "perpendicular," as used herein encompass identicality or near identicality including variations that may occur, for example, due to manufacturing processes. The term "substantially" may be used herein to emphasize this meaning, unless the context or other statements indicate otherwise.

The first redistribution substrate 100 may include a first insulating layer 101, first redistribution patterns 120, and first seed patterns 125. The first insulating layer 101 may be disposed on the bottom surface of the semiconductor chip 200 to cover the bottom surface of the semiconductor chip 200. For example, the first insulating layer 101 may be in contact with the bottom surface of the semiconductor chip 200. First openings 109 may be formed in the first insulating layer 101 to expose the chip pads 210. The first insulating layer 101 may be formed of or include an organic material (e.g., a photo-imageable dielectric (PID) material). For example, the PID material may be formed of or include at least one of photo-imageable polyimide, polybenzoxazole, phenol-based polymers, or benzocyclobutene-based polymers. In an embodiment, a plurality of the first insulating layers 101 may be provided. The number of the stacked first insulating layers 101 may vary, e.g., depending on embodiments. For example, the first insulating layers 101 may be formed of or include the same material. In this case, there may be no observable interface between adjacent ones of the first insulating layers 101. The top surface of the first redistribution substrate 100 may include a top surface of the uppermost one of the first insulating layers 101.

The first redistribution patterns 120 may be provided in the first openings 109. The first redistribution patterns 120 may be laterally spaced apart from each other and may be electrically separated from each other. Here, the expression "two elements are laterally spaced apart from each other" may mean that the elements are horizontally spaced apart from each other. The term "horizontal" may indicate a direction parallel to the top surface of the semiconductor chip 200 and/or the first direction D1. The first redistribution patterns 120 may be formed of or include at least one of metallic materials (e.g., copper). An expression "an element is electrically connected to the first redistribution substrate 100" may mean that the element is electrically connected to at least one of the first redistribution patterns 120.

Spatially relative terms, such as "beneath," "below," "lower," "above," "upper," "lateral," "vertical" and the like, may be used herein for ease of description to describe positional relationships. It will be understood that the spatially relative terms encompass different orientations of the device in addition to the orientation depicted in the figures.

The first redistribution patterns 120 may include a first via and a first interconnection line. The first via of the first redistribution patterns 120 may be provided in a corresponding one of the first insulating layers 101. The first interconnection line may be provided on a bottom surface of the first via and may be connected to the first via without an interface therebetween. For example, the first interconnection line may be integrally formed with the first via, e.g., as one body. A width of the first interconnection line, e.g., in a horizontal direction, may be larger than a width of a top surface of the first via, e.g., in the horizontal direction. The first interconnection line may extend to cover at least a portion of a bottom surface of a corresponding one of the first insulating layers 101. In the present specification, vias may be elements for vertical interconnections, and interconnection lines may be elements for horizontal interconnections. Here, the term "vertical" may be used to represent a direction parallel to the second direction D2. In the present specification, a level of an element may mean a vertical position of the element, and a difference in level between elements may be a difference between the vertical positions of the elements measured in the second direction D2 (e.g., a vertical distance).

The first redistribution patterns 120 may include first sub-redistribution patterns 121 and second sub-redistribution patterns 122. A first via of the first sub-redistribution patterns 121 may be disposed on a bottom surface of a corresponding chip pad 210 of the semiconductor chip 200. The second sub-redistribution patterns 122 may be disposed on bottom surfaces of the first sub-redistribution patterns 121 and may be coupled (e.g., electrically connected to and/or contact the first sub-redistribution patterns 121.

The number of the stacked first redistribution patterns 120 may not be limited to the illustrated example and may vary, e.g., depending on embodiments. For example, the first sub-redistribution patterns 121 may be omitted, and the second sub-redistribution patterns 122 may be disposed on bottom surfaces of the chip pads 210. Alternatively, third sub-redistribution patterns (not shown) may be further provided between the first sub-redistribution patterns 121 and the second sub-redistribution patterns 122. Therefore, even though the present disclosure describes features of the first sub-redistribution patterns and the second sub-redistribution patterns mostly, it will be appreciated that these features are easily applied and adapted to the examples where the third sub-redistribution patterns are disposed between the first sub-redistribution patterns and the second sub-redistribution patterns or where the first sub-redistribution patterns are omitted.

The first seed patterns 125 may be respectively provided on top surfaces of the first redistribution patterns 120. For example, each of the first seed patterns 125 may cover top and side surfaces of the first via and a top surface of the first interconnection line. Each of the first seed patterns 125 may not extend to a side surface of the first interconnection line of a corresponding one of the first redistribution patterns 120. The first seed patterns 125 in the uppermost one of the first insulating layers 101 may be interposed between the chip pads 210 and the first sub-redistribution patterns 121. The first seed patterns 125 in the uppermost one of the first insulating layers 101 may be in contact with the chip pads 210. The first seed patterns 125 may be formed of or include a material different from the first redistribution patterns 120. For example, the first seed patterns 125 may be formed of or include a conductive seed material. The conductive seed material may include or may be copper, titanium, and/or an alloy thereof. The first seed patterns 125 may be used as barrier layers and may prevent a material in the first redistribution patterns 120 from being diffused to the first insulating layers 101 through the first seed patterns 125.

The protection layer 301 may be provided on bottom surfaces of the second sub-redistribution patterns 122 to cover the second sub-redistribution patterns 122 and the lowermost one of the first insulating layers 101. The protection layer 301 may be formed of or include the same material as the first insulating layer 101. In the case where the protection layer 301 includes the same material as the lowermost one of the first insulating layers 101, there may be no observable interface between the protection layer 301 and the lowermost one of the first insulating layers 101. Second openings 309 may be formed in the protection layer 301 to expose the second sub-redistribution patterns 122.

The under-bump protection patterns 310 may be provided on a bottom surface of the protection layer 301. Each of the under-bump protection patterns 310 may have a closed loop shape and/or a ring shape. Third openings 319 may be formed in the under-bump protection patterns 310 to expose the second sub-redistribution patterns 122 and the protection layer 301. The under-bump protection patterns 310 may be provided to be laterally spaced apart from each other. The under-bump protection patterns 310 may have outer side surfaces 311 and inner side surfaces 312, which are opposite to each other. Between the outer side surfaces 311 of the under-bump protection patterns 310 adjacent to each other, at least a portion of a top/bottom surface of the protection layer 301 may be exposed. In an embodiment, the under-bump protection patterns 310 may be formed of or include a positive PID material or a negative PID material.

Alternatively, the under-bump protection patterns 310 may include an adhesive insulating film. The adhesive insulating film may include an Ajinomoto build-up film (ABF). In an embodiment, the under-bump protection patterns 310 may be formed of or include the same material as the protection layer 301. In this case, there may be no observable interface between the under-bump protection patterns 310 and the protection layer 301. For example, the under-bump protection patterns 310 may be integrally formed with the protection layer 310 as one body.

The under-bump patterns 330 may be disposed on the bottom surfaces of the second sub-redistribution patterns 122, respectively. The under-bump patterns 330 may be provided in the second openings 309 and the third openings 319. Accordingly, the under-bump patterns 330 may be electrically connected to the first redistribution substrate 100. The description that follows explains one under-bump pattern 330, one under-bump seed pattern 320, one under-bump protection pattern 310, one solder ball 400, and one second sub-redistribution pattern 122 as an example, for convenience in description. However, it will be appreciated that the description is just an example and the disclosure includes embodiments including multiple identical components to each elements as disclosed in the drawings and in the above description.

As shown in FIG. 3A, the under-bump pattern 330 may have a height H1 ranging from 5 µm to 30 µm. The height H1 of the under-bump pattern 330 may be the largest height of the under-bump pattern 330. For example, the height H1 of the under-bump pattern 330 may be a vertical distance between a first top surface 330c and a second bottom surface 330b of the under-bump pattern 330.

The under-bump protection pattern 310 may have a height H2 ranging from 3 µm to 100 µm. The height H2 of the under-bump protection pattern 310 may be the largest height of the under-bump protection pattern 310, e.g., a vertical distance between a bottom surface 310a and a top surface of the under-bump protection pattern 310. In an embodiment, the bottom surface 310a of the under-bump protection pattern 310 may be provided at a level equal to or higher than the second bottom surface 330b of the under-bump pattern 330.

An angle A1 between the under-bump protection pattern 310 and the protection layer 301 may be adjusted depending on a material included in the under-bump protection pattern 310. In the case where the under-bump protection pattern 310 includes a positive PID material, the angle A1 may range from 45° to 90°. In the case where the under-bump protection pattern 310 includes a negative PID material, the angle A1 may range from 90° to 180°. In the case where the under-bump protection pattern 310 includes an adhesive insulating film, the angle A1 may be about 90°. For example, the angel A1 may be an angle between the bottom surface of the protection layer 301 and a side surface of the under-bump protection pattern 310, e.g., in a plane including a center point of the under-bump protection pattern 310 and being perpendicular to the bottom surface of the protection layer 301.

The semiconductor package 10 may further include the under-bump seed pattern 320. The under-bump seed pattern 320 may be provided on the under-bump pattern 330. The under-bump seed pattern 320 may be provided between the under-bump pattern 330 and the under-bump protection pattern 310, between the under-bump pattern 330 and the protection layer 301, and between the under-bump pattern 330 and the second sub-redistribution pattern 122. A thickness of the under-bump seed pattern 320 may be smaller than a thickness of the under-bump pattern 330. The under-bump seed pattern 320 may be formed of or include a conductive seed material. The under-bump seed pattern 320 may be formed of or include a material different from the under-bump pattern 330. For example, the under-bump seed pattern 320 may be formed of or include at least one of titanium or titanium-copper alloy. As another example, the under-bump seed pattern 320 may be formed of or include the same material as the under-bump pattern 330. In this case, there may be no observable interface between the under-bump seed pattern 320 and the under-bump pattern 330.

The solder ball 400 may be disposed on a bottom surface of the first redistribution substrate 100. For example, the solder ball 400 may be disposed on and coupled to a corresponding one of the under-bump patterns 330. The solder ball 400 may include a solder material. In an embodiment, the solder material may include or may be tin, bismuth, lead, silver, or an alloy thereof.

The under-bump pattern 330 may be formed to have a stepwise bottom surface. For example, the under-bump pattern 330 may have a first bottom surface 330a and a second bottom surface 330b. The first bottom surface 330a of the under-bump pattern 330 may be provided on the second sub-redistribution pattern 122. The second bottom surface 330b of the under-bump pattern 330 may be provided on the protection layer 301. For example, the first bottom surface 330a may vertically overlap the second sub-redistribution pattern 122 and may not vertically overlap the protection layer 301, and the second bottom surface 330b may vertically overlap the protection layer 301. The first bottom surface 330a of the under-bump pattern 330 may be provided at a level that is different from (e.g., higher than) the second bottom surface 330b. The solder ball 400 may cover (e.g., contact) the first and second bottom surfaces 330a and 330b of the under-bump pattern 330. Since the under-bump pattern 330 has a stepwise shape, a contact area between the under-bump pattern 330 and the solder ball 400 may be increased. For example, the step shape of the under-bump pattern 330 may be beneficial for the solder ball 400 and the under-bump pattern 330 to contact each other. Thus, a bonding strength between the under-bump pattern 330 and the solder ball 400 may be increased to prevent a crack from being formed between the under-bump pattern 330 and the solder ball 400. In addition, a volume of the solder ball 400 may be increased because of the step shape of the under-bump pattern 330 in that the solder ball 400 may fill a recessed area of the step shape of the under-bump pattern 330. Accordingly, the semiconductor package 10 may have improved reliability and durability.

The under-bump protection patterns 310 may be disposed on side surfaces of the under-bump patterns 330. Thus, the under-bump protection patterns 310 may be beneficial to prevent the side surfaces of the under-bump patterns 330 from being corroded by an external cause. The under-bump protection patterns 310 may be disposed to be spaced apart from each other. If heat is applied to the under-bump patterns 330 and the solder balls 400, the under-bump patterns 330 and the solder balls 400 may be expanded, but even in such a case, the under-bump protection patterns 310 may be beneficial to prevent a leakage current issue and a short circuit issue from occurring between adjacent ones of the solder balls 400, e.g., because the under-bump protection patterns 310 may be a barrier against an expansion of the solder balls 400. Furthermore, the under-bump protection patterns 310 may be beneficial to prevent the leakage current issue and the short circuit issue from occurring between adjacent ones of the solder balls 400, even when there is a damage caused by an external cause (e.g., sulfur ions). For example, the under-bump protection patterns 310 may be beneficial to prevent/reduce leakage current and short circuits. In an embodiment, even when a stress is exerted on the under-bump patterns 330 and the solder balls 400, the stress may be absorbed by the under-bump protection patterns 310. Accordingly, the under-bump protection patterns 310 may be beneficial to prevent a crack from being formed in the protection layer 301. As a result, reliability and durability of the semiconductor package 10 may be further improved.

Figure 3B:
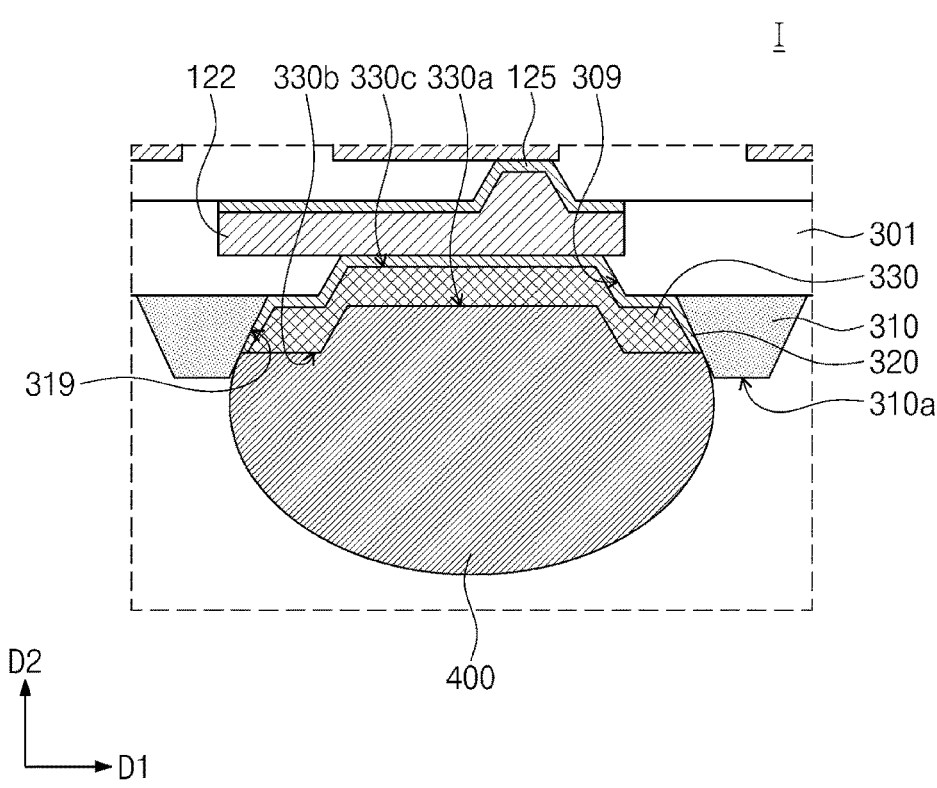
FIG. 3B is a diagram illustrating an under-bump protection pattern and an under-bump pattern, according to an embodiment of the inventive concept.

FIG. 3B is an enlarged sectional view illustrating a portion 'I' of FIG. 2 (in particular, to illustrate an under-bump protection pattern and an under-bump pattern according to an embodiment of the inventive concept).

Referring to FIG. 3B, the bottom surface 310a of the under-bump protection pattern 310 may be located at a level that is lower than the second bottom surface 330b of the under-bump pattern 330. In this case, the under-bump pattern 330 and the solder ball 400 may be more effectively protected by the under-bump protection pattern 310. As a result, the reliability and durability of the semiconductor package 10 may be further improved, compared with the embodiment of FIG. 2.

FIGS. 4A to 4L are diagrams illustrating a method of manufacturing a semiconductor package according to an embodiment of the inventive concept. In the following description with respect to FIGS. 4A to 4L, relative vertical positions (e.g., top and bottom surfaces) of an element will be given based on referenced figures.

Figure 4A:
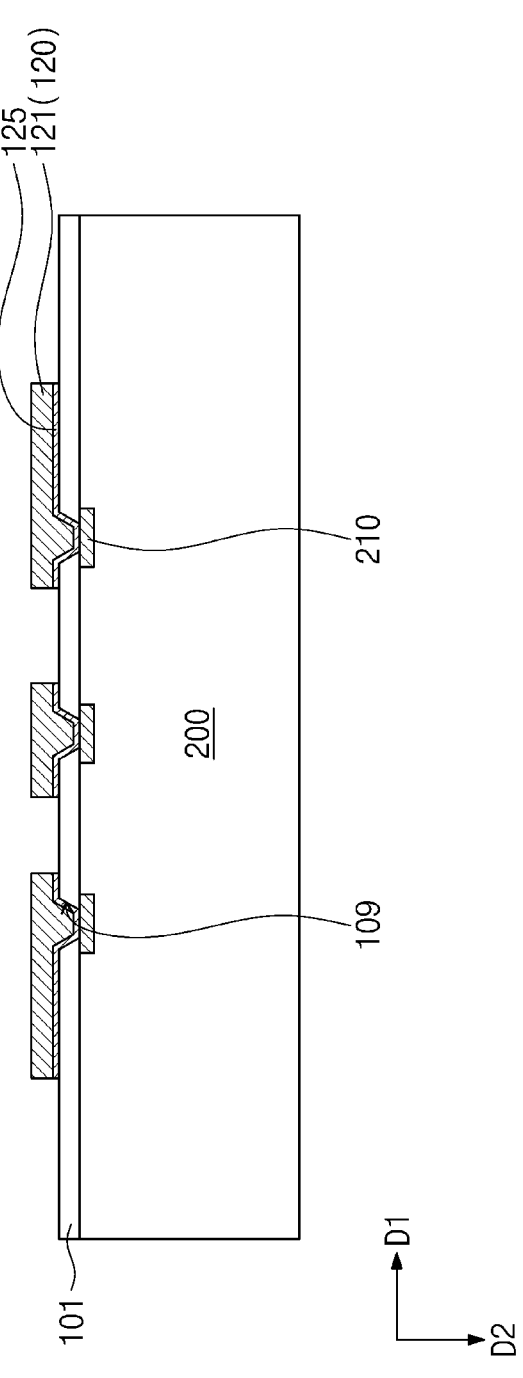
FIGS. 4A to 4L are diagrams illustrating a method of manufacturing a semiconductor package according to an embodiment of the inventive concept.

Referring to FIG. 4A, the semiconductor chip 200 may be provided. The chip pads 210 may be provided on the top surface of the semiconductor chip 200. The first insulating layer 101 may be formed on the semiconductor chip 200. The first openings 109 may be formed in the first insulating layer 101 to expose top surfaces of the chip pads 210. The first openings 109 may be formed by performing a patterning process including an exposure process and a developing process, e.g. a photolithography process. In some embodiments, the semiconductor chip 200 may be provided as a form of a semiconductor substrate including a plurality of chip regions which may be divided into a plurality of semiconductor chips 200 in a later step, e.g., after forming the first redistribution substrate 100 on the semiconductor substrate. In certain embodiments, the semiconductor chip 200 may be provided as a form of a chip which may be attached on a substrate or a film together with other semiconductor chips 200 to form the first redistribution substrate 100 on the semiconductor chips 200. In this case, the first redistribution substrate 100 may be divided in a later step and the substrate/film may be removed from the semiconductor chips 200 to form semiconductor packages.

The first redistribution patterns 120 and the first seed patterns 125 may be formed on a top surface of the first insulating layer 101 and in the first openings 109. The first redistribution patterns 120 may be formed by performing an electroplating process using the first seed patterns 125 as an electrode. The first redistribution patterns 120 may be the first sub-redistribution patterns 121.

Figure 4B:
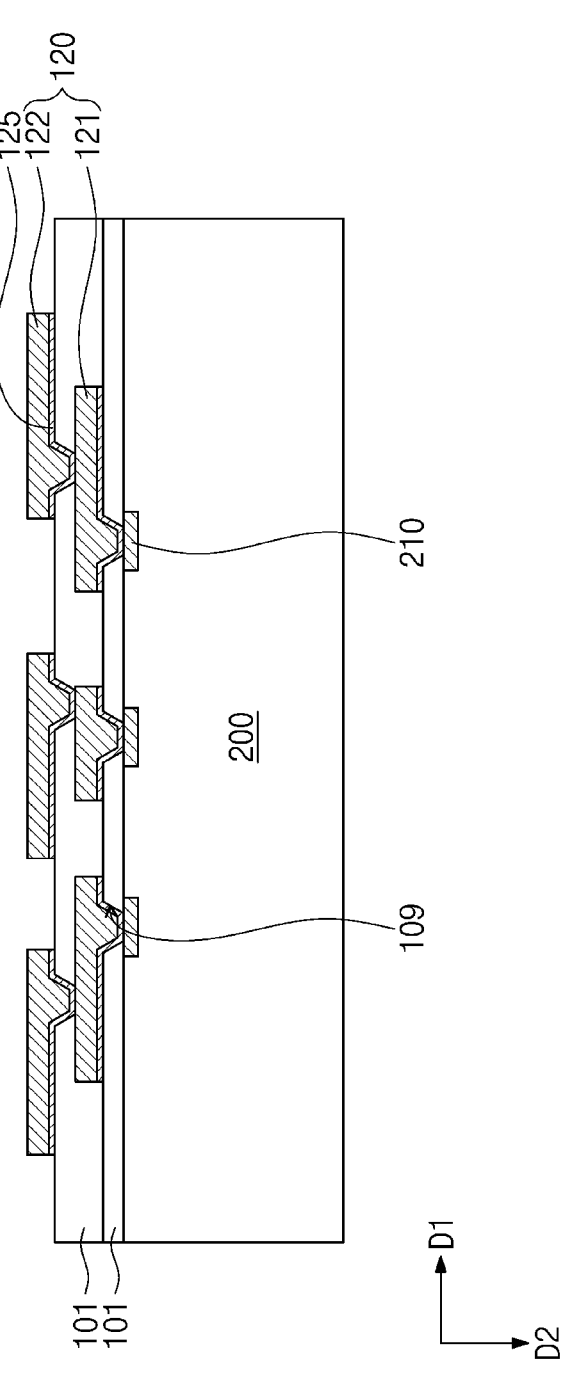

Referring to FIG. 4B, the first redistribution substrate 100 may be manufactured by repeating the processes of forming the first insulating layer 101, the first seed patterns 125, and the first redistribution patterns 120. The first redistribution substrate 100 may include the first insulating layer 101, the first redistribution patterns 120, and the first seed patterns 125. The first redistribution patterns 120 may include the first sub-redistribution patterns 121 and the second sub-redistribution pattern 122. The second sub-redistribution patterns 122 may be formed on the first sub-redistribution patterns 121.

Figure 4C:
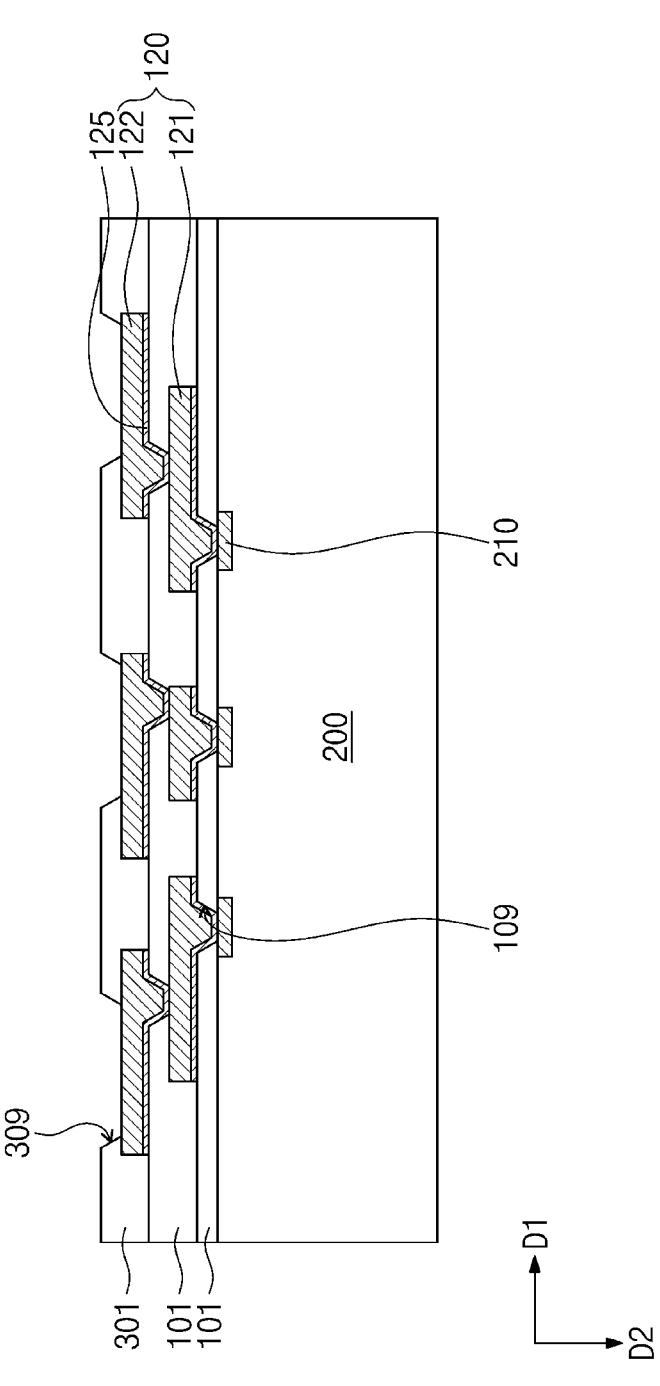

Referring to FIG. 4C, the protection layer 301 may be formed on the top surface of the first redistribution substrate 100 to cover/contact the second sub-redistribution patterns 122. The second openings 309 may be formed in the protection layer 301 to expose the second sub-redistribution patterns 122. In an embodiment, the second openings 309 may be formed by performing a patterning process (e.g., a photolithography process) including an exposure process and a developing process.

Figure 4D:
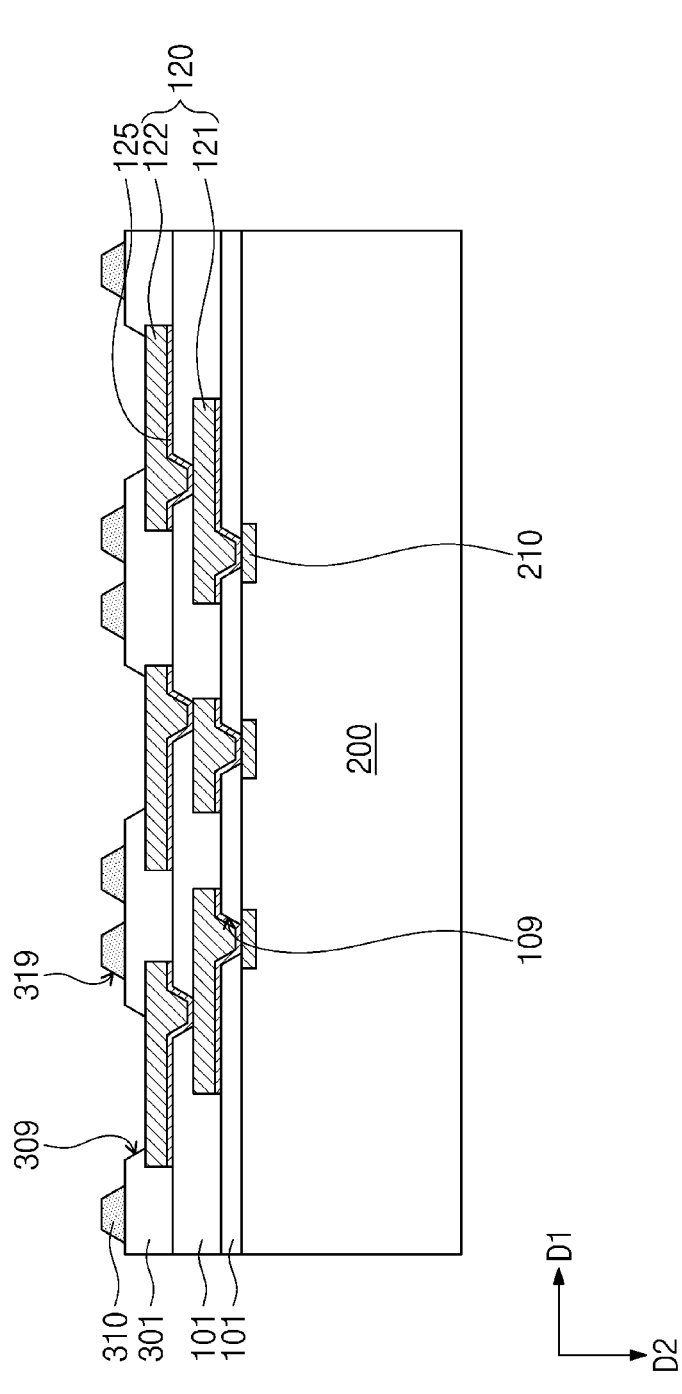

Referring to FIG. 4D, the under-bump protection patterns 310 may be formed on a top surface of the protection layer 301. The third openings 319 may be formed in the under-bump protection patterns 310. The third openings 319 may be connected to the second openings 309, respectively. The third openings 319 may be formed to expose the top surface of the protection layer 301 and top surfaces of the second sub-redistribution patterns 122. As an example, the under-bump protection patterns 310 may be formed by a spin coating process. As another example, the under-bump protection patterns 310 may be formed by forming a film on the protection layer 301 and etching the film. The under-bump protection patterns 310 may be laterally spaced apart from each other. The under-bump protection patterns 310 may be formed to expose the top surface of the protection layer 301. Here, since heights of the under-bump protection patterns 310 can be adjusted, the embodiment may be beneficial to form the under-bump protection patterns 310 with various heights.

Figure 4E:
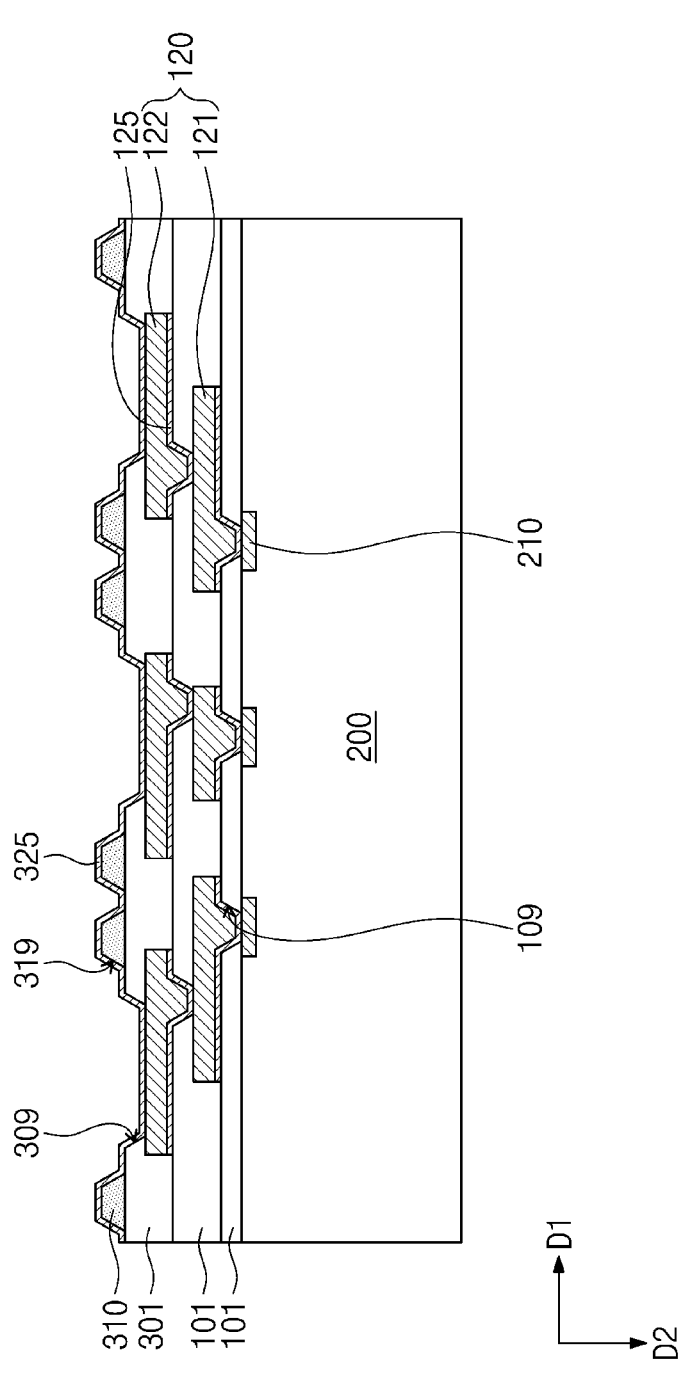

Referring to FIG. 4E, an under-bump seed layer 325 may be formed in the second and third openings 309 and 319 to cover top and side surfaces of the under-bump protection patterns 310 and the top surface of the protection layer 301. For example, the under-bump seed layer 325 may be formed to conformally cover bottom and side surfaces of the second openings 309, the top surface of the protection layer 301, and the top and side surfaces of the under-bump protection patterns 310. In an embodiment, the under-bump seed layer 325 may be formed by a deposition process (e.g., a sputtering process). In this case, the under-bump seed layer 325 may be formed of or include titanium.

Figure 4F:
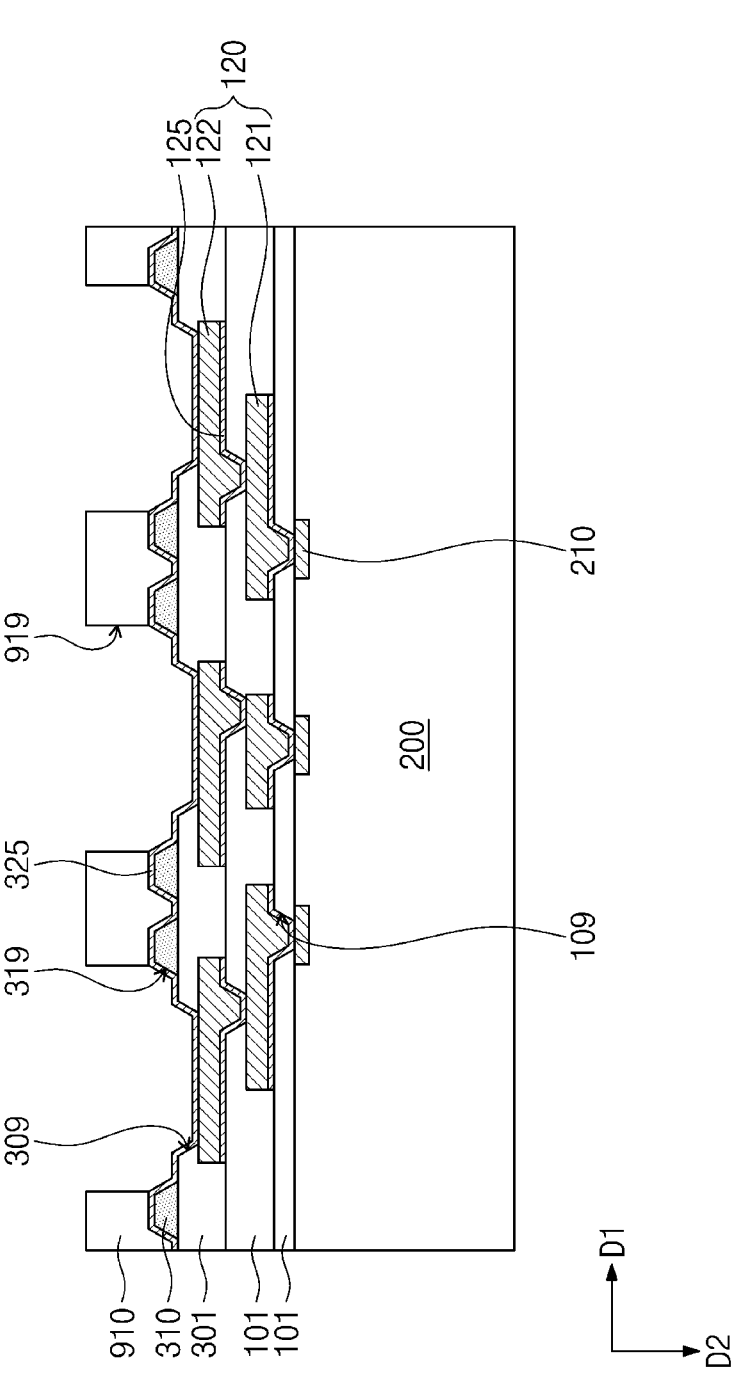

Referring to FIG. 4F, a first resist pattern 910 may be formed on the under-bump seed layer 325. The first resist pattern 910 may be formed of or include at least one of organic materials (e.g., polymer materials). The first resist pattern 910 may be patterned by an exposure and developing process (e.g., a photolithography process) to form first guide openings 919 in the first resist pattern 910. The first guide openings 919 may expose the under-bump seed layer 325. The first guide openings 919 may be connected to the third openings 319, respectively. Each of the first guide openings 919 may be formed to have a width that is larger than a width of a corresponding one of the third openings 319. The widths of the openings 319 and 919 may be measured in a horizontal direction.

Figure 4G:
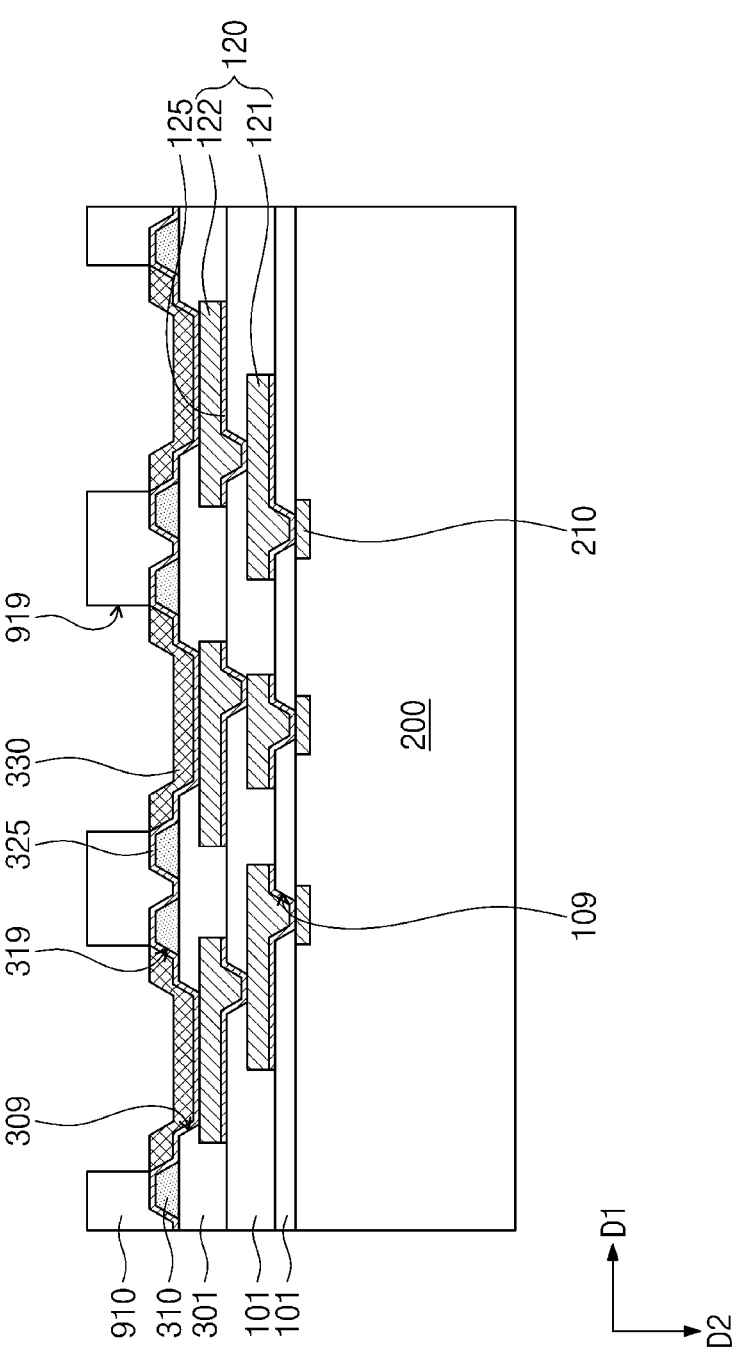

Referring to FIG. 4G, the under-bump patterns 330 may be formed in the second openings 309, the third openings 319, and the first guide openings 919, respectively, to cover the under-bump seed layer 325. The under-bump patterns 330 may be formed by an electroplating process using the under-bump seed layer 325 as an electrode. The electroplating process may be finished before the under-bump patterns 330 extend to a region on a top surface of the first resist pattern 910. For example, the under-bump patterns 330 may be formed within the second openings, the third openings and the first guide openings 309, 319 and 919 by the electroplating process.

Figure 4H:
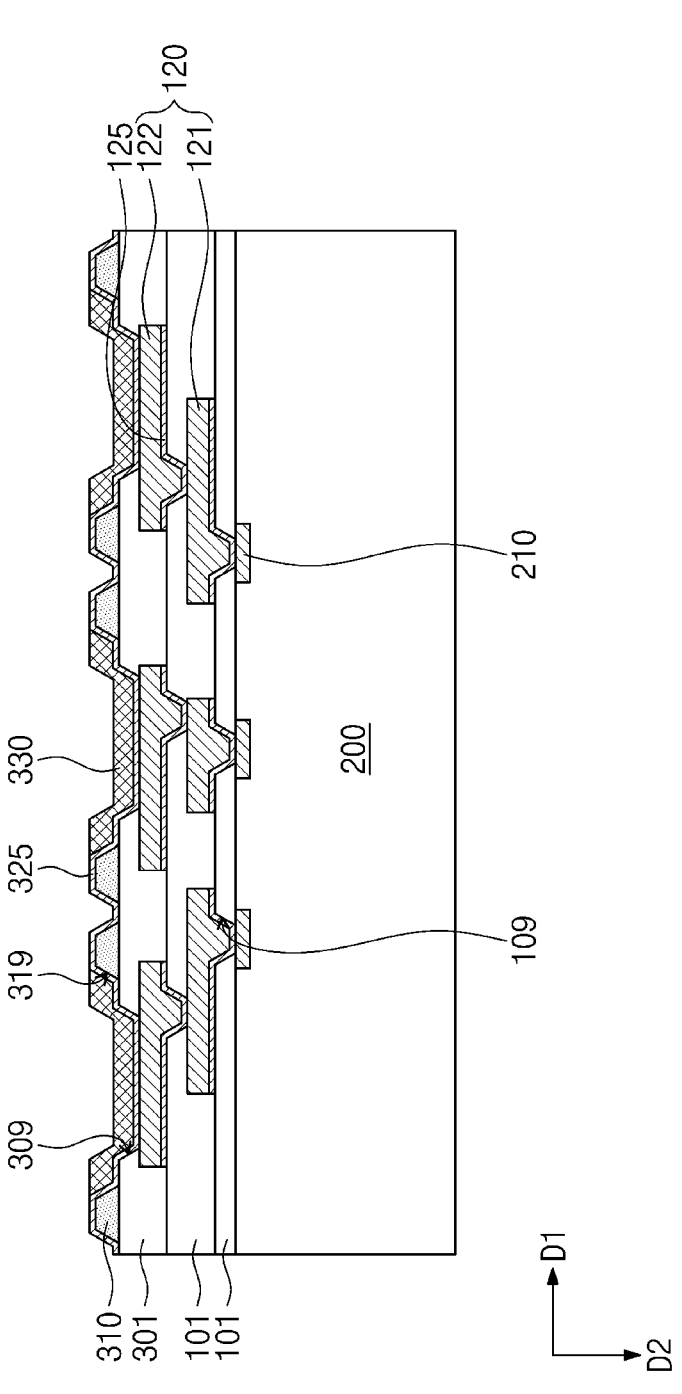

Referring to FIG. 4H, the first resist pattern 910 may be removed to expose first portions of the under-bump seed layer 325. The removal of the first resist pattern 910 may be performed by a strip process.

Figure 4I:
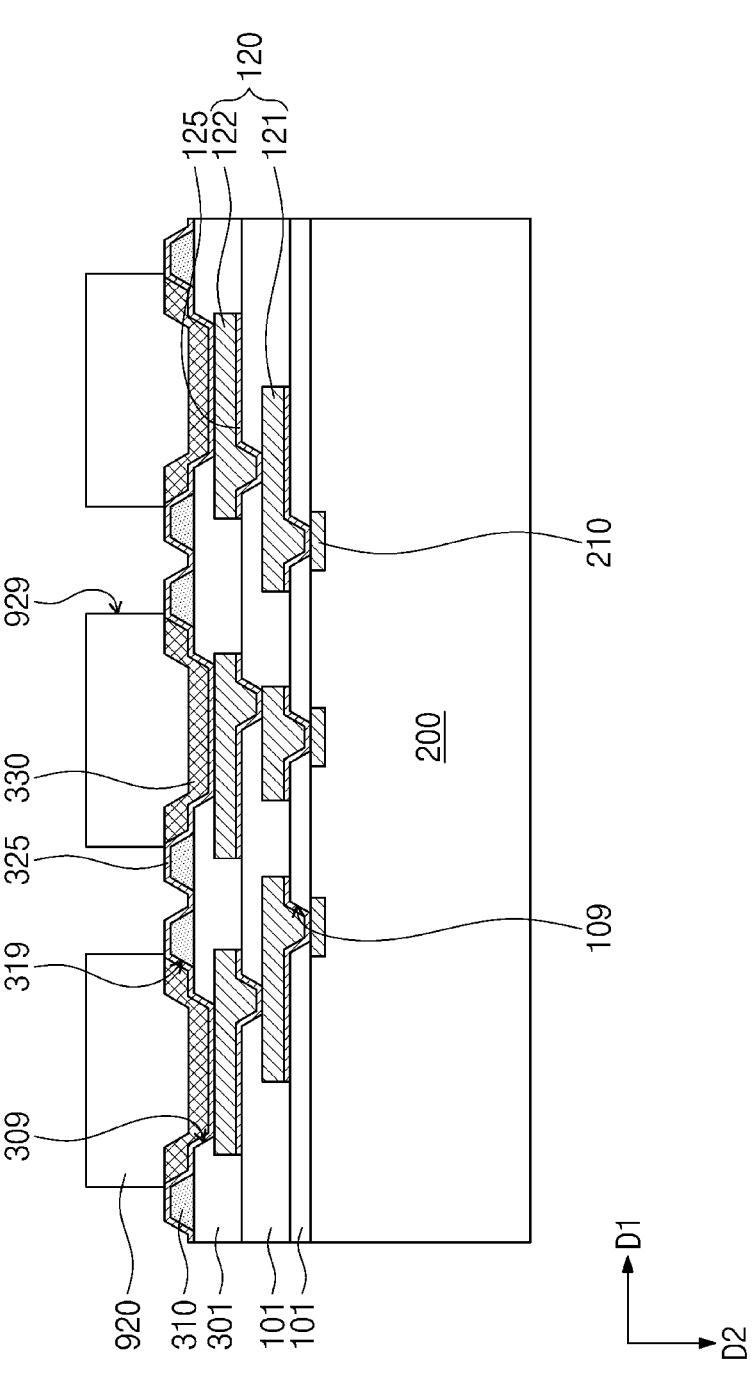

Referring to FIG. 4I, a second resist pattern 920 may be formed on the under-bump patterns 330. The second resist pattern 920 may cover/contact top surfaces of the under-bump patterns 330. The second resist pattern 920 may be formed of or include an organic material (e.g., polymer). The second resist pattern 920 may be patterned by an exposure and developing process, e.g., a photolithography process, to form second guide openings 929 in the second resist pattern 920. The second guide openings 929 may be formed to expose the first portion of the under-bump seed layer 325.

Figure 4J:
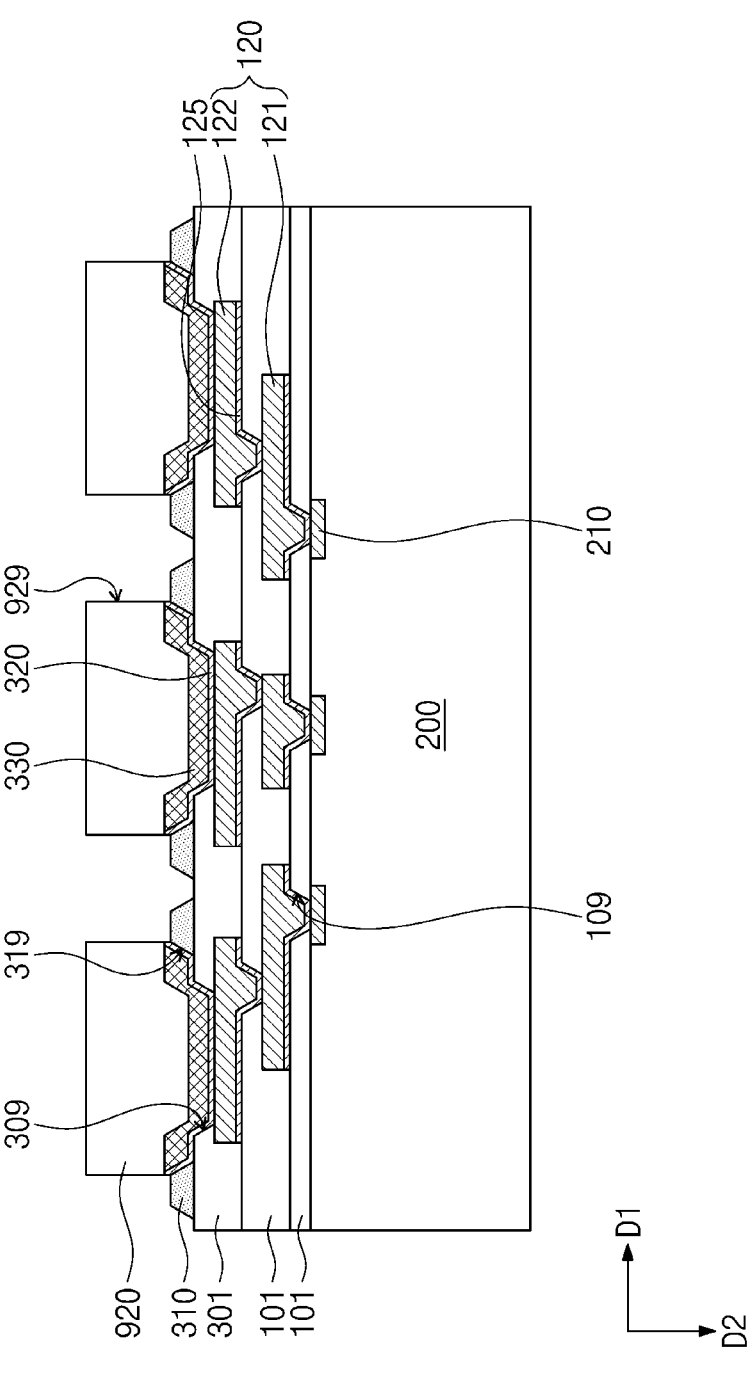

Referring to FIG. 4J, the exposed first portion of the under-bump seed layer 325 may be etched to form the under-bump seed patterns 320. In an embodiment, during this step, the top surfaces of the under-bump protection patterns 310 and the top surfaces of the protection layer 301 may be exposed to the outside. For example, portions of the top surfaces of the protection layer 301 may be exposed between the under-bump protection patterns 310 during the etching process forming the under-ump seed patterns 320. The etching process may be performed in a dry etching manner. Since a liquid compound is not used in a dry etching process, the dry etching process may be beneficial to prevent a corrosion phenomenon. For example, the dry etching process may be beneficial to prevent the Galvanic corrosion phenomenon from occurring between copper and titanium, which are respectively included in the under-bump patterns 330 and the under-bump seed patterns 320. In addition, due to the dry etching manner, the etching process may be performed in an anisotropic manner, and this may prevent a lateral etching issue. By adjusting the process condition (e.g., an etching time) for the etching process, the method may be beneficial to easily control heights of the under-bump protection patterns 310. For example, the under-bump protection patterns 310 may be partially etched during the etching process of the under-bump seed layer 325.

Figure 4K:
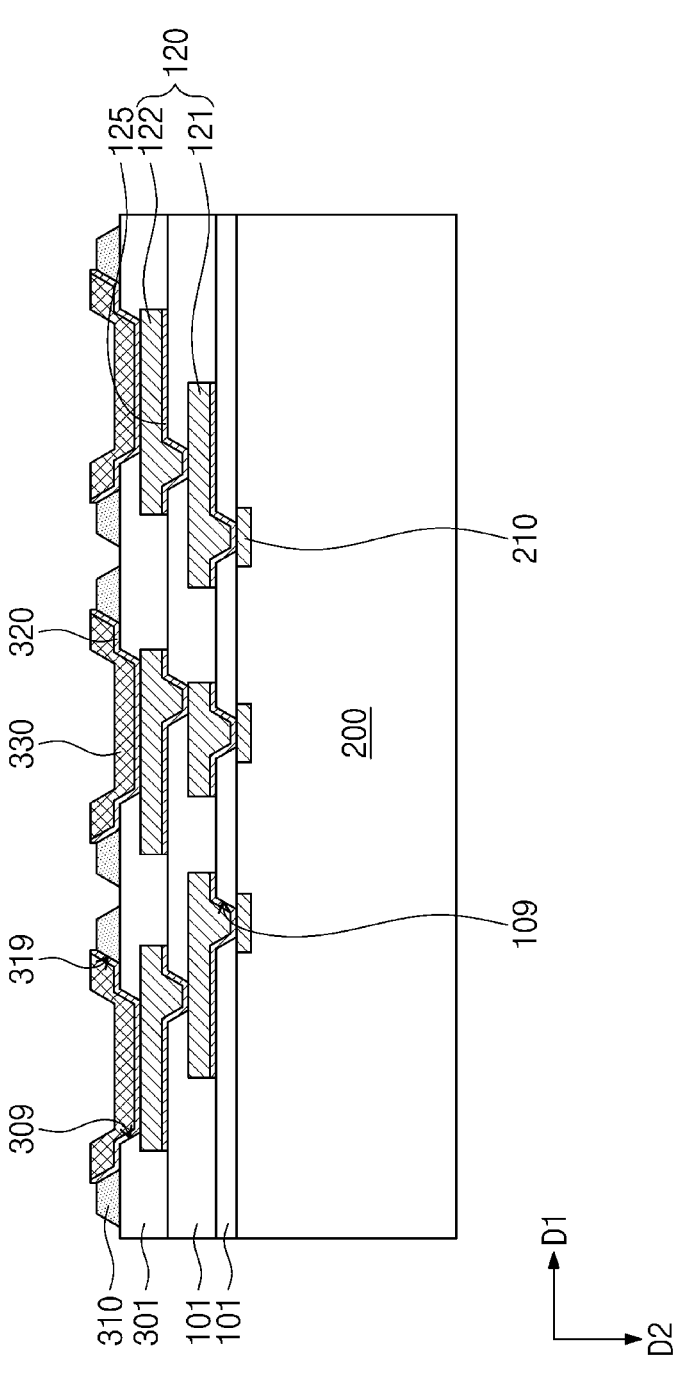

Referring to FIG. 4K, the second resist pattern 920 may be removed to expose the top surfaces of the under-bump patterns 330. The removal of the second resist pattern 920 may be performed by a strip process.

Figure 4L:
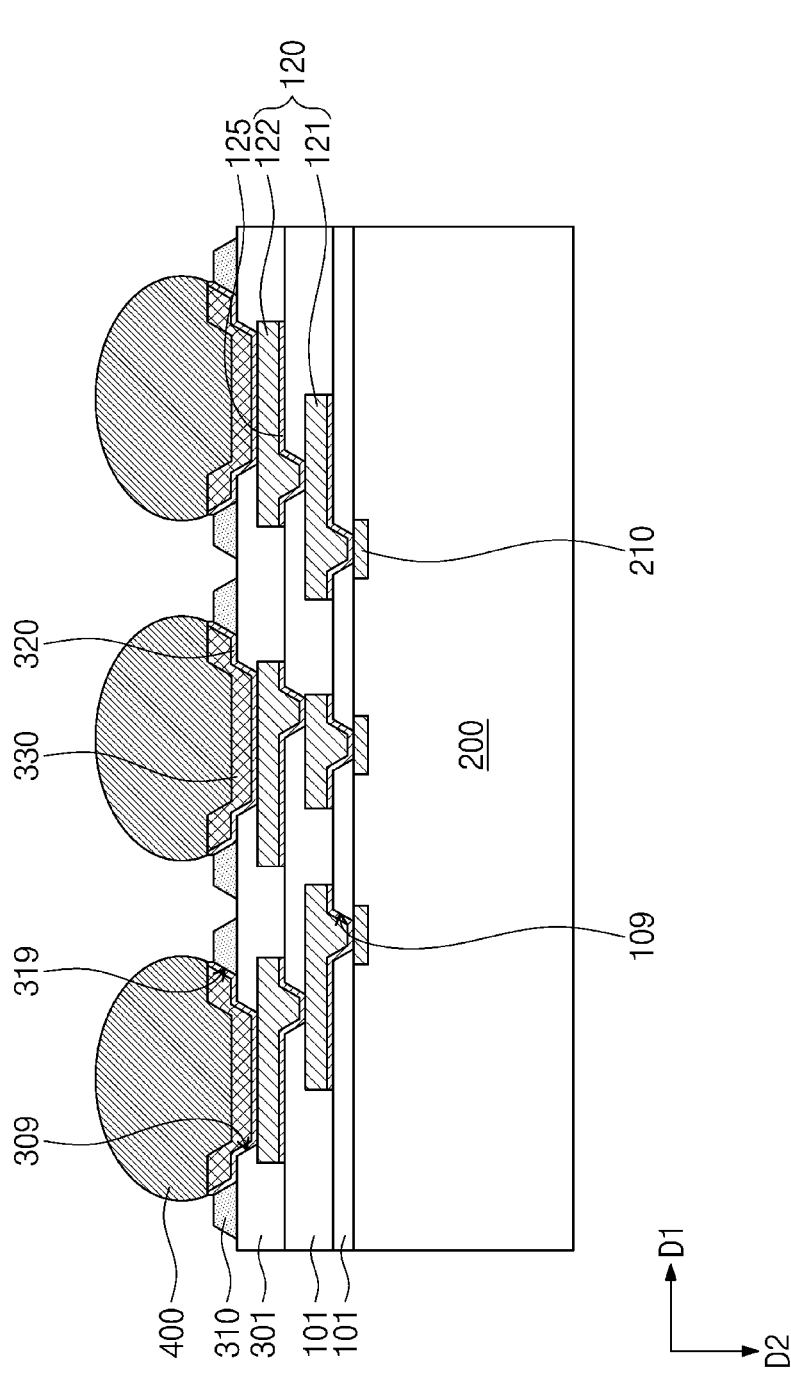

Referring to FIG. 4L, the solder balls 400 may be formed on the under-bump patterns 330. Since the under-bump patterns 330 are formed to have a stepwise shape, the solder balls 400 may be robustly coupled to the under-bump patterns 330. For example, the step shapes of the under-bump patterns 330 may be beneficial to the adhesion of the solder balls 400 to the under-bump patterns 330 by increasing contact areas between the solder balls 400 and the under-bump patterns 330.

Referring back to FIG. 2, the semiconductor chip 200 and the first redistribution substrate 100 may be inverted such that the solder balls 400 are placed in a lower level. Accordingly, the fabrication of the semiconductor package 10 may be finished.

Figure 5:
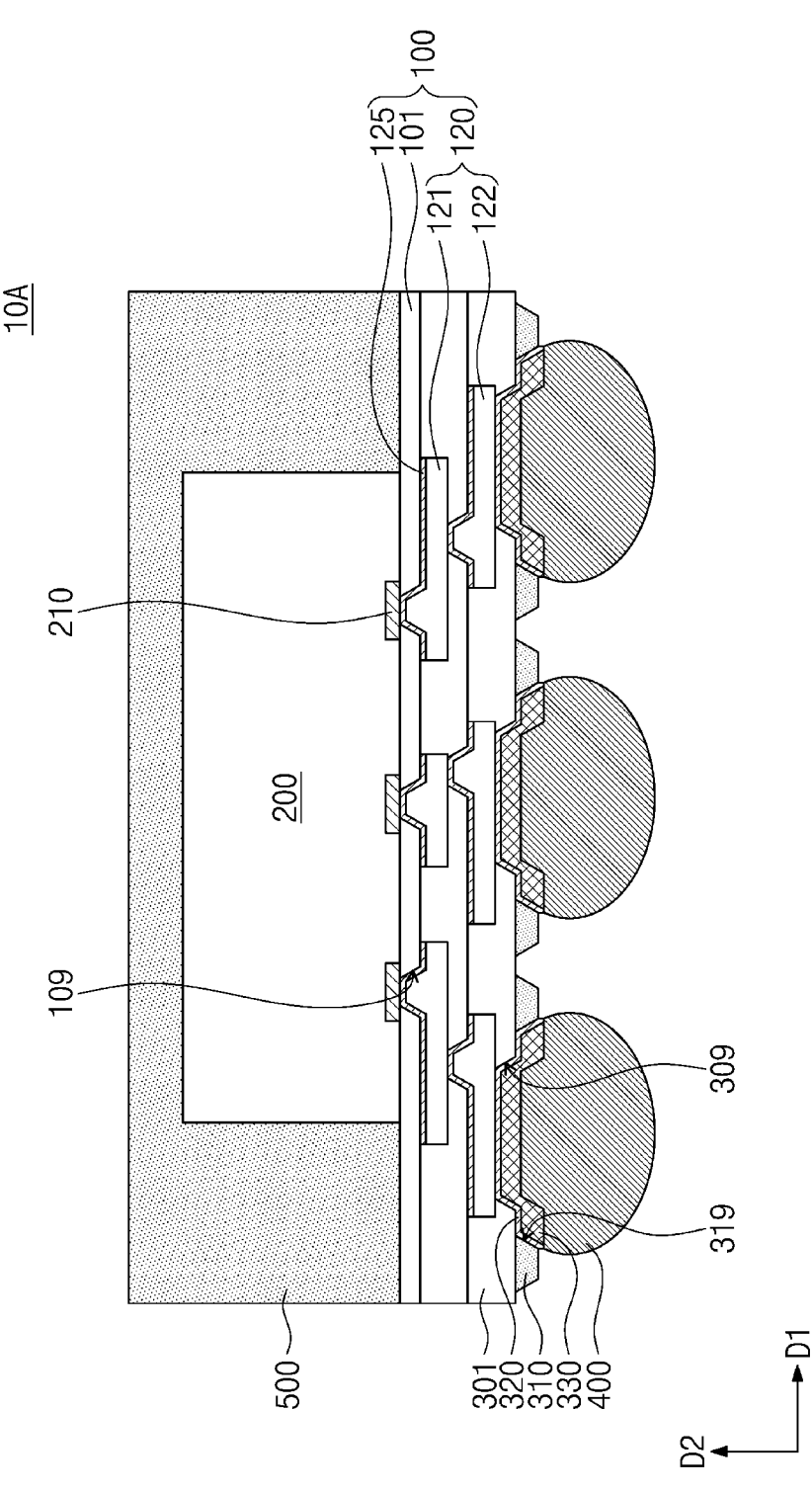
FIG. 5 is a cross-sectional view illustrating a semiconductor package according to an embodiment of the inventive concept.

FIG. 5 is a cross-sectional view illustrating a semiconductor package according to an embodiment of the inventive concept.

Referring to FIG. 5, a semiconductor package 10A may include the first redistribution substrate 100, the semiconductor chip 200, the protection layer 301, the under-bump protection patterns 310, the under-bump seed patterns 320, the under-bump patterns 330, the solder balls 400, and a mold layer 500.

The mold layer 500 may be provided on the top surface of the first redistribution substrate 100 to cover/surround the semiconductor chip 200. As an example, the mold layer 500 may cover/contact top and side surfaces of the semiconductor chip 200. Unlike that illustrated in the drawings, the mold layer 500 may be provided to cover/contact the side surface of the semiconductor chip 200 and to expose the top surface of the semiconductor chip 200. A side surface of the mold layer 500 may be vertically aligned to a side surface of the first redistribution substrate 100. For example, the side surface of the mold layer 500 may be coplanar with the side surface of the first redistribution substrate 100. The mold layer 500 may not extend to a region between the first redistribution substrate 100 and the semiconductor chip 200. The mold layer 500 may include or be formed of an insulating polymer (e.g., epoxy-based molding compound).

The protection layer 301, the under-bump protection patterns 310, the under-bump seed patterns 320, the under-bump patterns 330, and the solder balls 400 may be configured to have substantially the same features as those in the embodiment of FIG. 1, 2, 3A, or 3B.

Figure 6A:
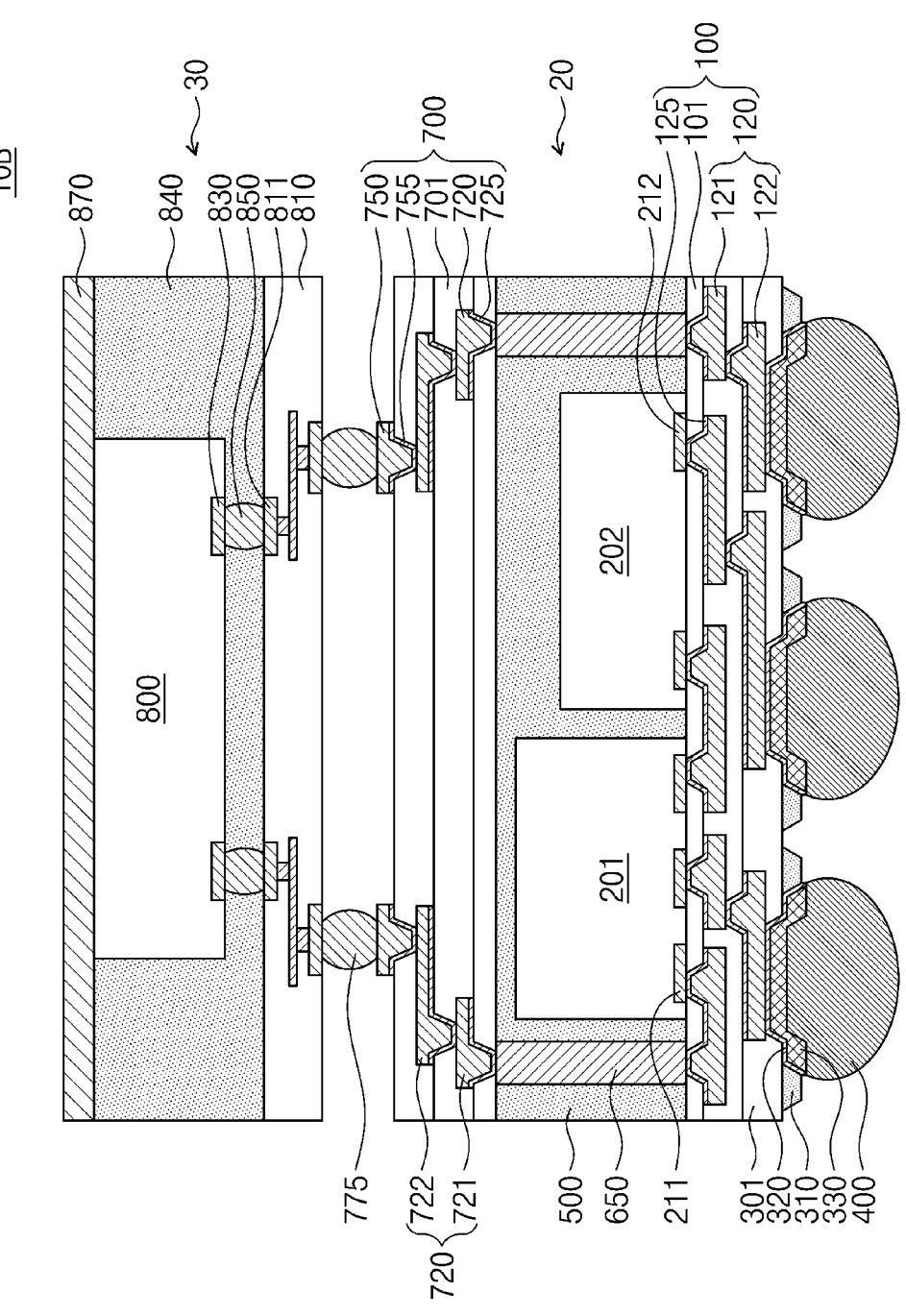
FIG. 6A is a cross-sectional view illustrating a semiconductor package according to an embodiment of the inventive concept.

FIG. 6A is a cross-sectional view illustrating a semiconductor package according to an embodiment of the inventive concept.

Referring to FIG. 6A, a semiconductor package 10B may include a lower package 20, an upper package 30, and connection bumps 775. The lower package 20 may include the first redistribution substrate 100, a first semiconductor chip 201, a second semiconductor chip 202, the protection layer 301, the under-bump protection patterns 310, the under-bump seed patterns 320, the under-bump patterns 330, the solder balls 400, conductive structures 650, and a second redistribution substrate 700. The protection layer 301, the under-bump protection patterns 310, the under-bump seed patterns 320, the under-bump patterns 330, and the solder balls 400 may be configured to have substantially the same features as those in the embodiment of FIG. 2.

Each of the first and second semiconductor chips 201 and 202 may be mounted on the top surface of the first redistribution substrate 100. Each of the first and second semiconductor chips 201 and 202 may be provided to have features the same as or similar to the semiconductor chip 200 described with reference to FIG. 2 unless specified otherwise. The second semiconductor chip 202 may be laterally spaced apart from the first semiconductor chip 201. In certain embodiments, the second semiconductor chip 202 may be of a kind different from the first semiconductor chip 201. For example, the first semiconductor chip 201 may include or may be one of a logic chip, a memory chip, or a power management chip, and the second semiconductor chip 202 may include or may be another of the logic chip, the memory chip, or the power management chip. The power management chip may include a power management integrated circuit (PMIC). As an example, the first semiconductor chip 201 may be an application-specific integrated circuit (ASIC) chip, and the second semiconductor chip 202 may be the power management chip. Alternatively, the second semiconductor chip 202 may be of the same kind as the first semiconductor chip 201. Unlike that illustrated in the drawings, at least one of the first and second semiconductor chips 201 and 202 may be omitted. In an embodiment, a third semiconductor chip (not shown) may be further mounted on the top surface of the first redistribution substrate 100. For example, one or more semiconductor chips may be additionally mounted on the top surface of the first redistribution substrate 100 illustrated in FIG. 6A.

The conductive structures 650 may be disposed on the top surface of the first redistribution substrate 100. For example, the conductive structures 650 may be disposed on a top surface of an edge region of the first redistribution substrate 100. The conductive structures 650 may be laterally spaced apart from the first and second semiconductor chips 201 and 202. The conductive structures 650 may be spaced apart from each other. Metal pillars may be provided on the first redistribution substrate 100 to form the conductive structures 650. For example, each of the conductive structures 650 may be one of the metal pillars. The conductive structures 650 may be formed of or include at least one of metallic materials (e.g., copper). For example, the metal pillars may be formed of copper.

The first seed patterns 125 in the uppermost one of the first insulating layers 101 may be respectively in contact with first chip pads 211 of the first semiconductor chip 201, second chip pads 212 of the second semiconductor chip 202, or the conductive structures 650. The first and second semiconductor chips 201 and 202 may be electrically connected to each other through the first redistribution substrate 100. Each of the conductive structures 650 may be electrically connected to a corresponding one of the first semiconductor chip 201, the second semiconductor chip 202, and the solder balls 400 through the first redistribution substrate 100.

The mold layer 500 may be disposed on the top surface of the first redistribution substrate 100 to cover/contact the first and second semiconductor chips 201 and 202. The mold layer 500 may further cover/contact side surfaces of the conductive structures 650. The mold layer 500 may not cover top surfaces of the conductive structures 650. For example, the top surfaces of the conductive structures 650 may be exposed from the mold layer (e.g., from a top surface of the mold layer 500). The side surface of the mold layer 500 may be aligned to the side surface of the first redistribution substrate 100. For example, each of the first redistribution layer 100 and the mold layer 500 may have a rectangular shape in a plan view and may have four side surfaces. Each of the side surfaces of the mold layer 500 may be coplanar with a corresponding side surface of the first redistribution substrate 100.

The second redistribution substrate 700 may be provided on the top surface of the mold layer 500 and top surfaces of the conductive structures 650. The second redistribution substrate 700 may include second insulating layers 701, second redistribution patterns 720, and redistribution pads 750. The second insulating layers 701 may be stacked on the mold layer 500. The second insulating layers 701 may be organic insulating layers. The second insulating layers 701 may include an adhesive insulating film, such as an Ajinomoto build-up film. In an embodiment, the second insulating layers 701 may be formed of or include an insulating polymer (e.g., epoxy-based polymer). In another embodiment, the second insulating layers 701 may be formed of or include a photo-imageable insulating material. As an example, the second insulating layers 701 may be formed of or include the same material. There may be no observable interface between adjacent ones of the second insulating layers 701, but the inventive concept is not limited to this example. The number of the second insulating layers 701 may vary, e.g., depending on embodiments.

The second redistribution patterns 720 may be laterally spaced apart from each other and may be electrically separated from each other. Each of the second redistribution patterns 720 may include a second via and a second interconnection line. The second via may be provided in a corresponding one of the second insulating layers 701. Second interconnection line may be provided on the second via. In each of the second redistribution patterns 720, a width of the second interconnection line may be larger than a width of a top surface of the second via. For example, the widths of the second interconnection line and the top surface of the second via may be measured in a horizontal direction. The second interconnection line of each of the second redistribution patterns 720 may extend to cover at least a portion of a top surface of a corresponding one of the second insulating layers 701. The second redistribution patterns 720 may be formed of or include at least one of metallic materials (e.g., copper).

The second redistribution patterns 720 may include a lower redistribution pattern 721 and an upper redistribution pattern 722, which are sequentially stacked. The second via of the lower redistribution pattern 721 may be disposed on and coupled to (e.g., contact) a corresponding one of the conductive structures 650. The upper redistribution pattern 722 may be disposed on the lower redistribution pattern 721 and may be coupled to (e.g., contact) the lower redistribution pattern 721. The expression "an element is electrically connected to the second redistribution substrate 700" may mean that the element is electrically connected to at least one of the second redistribution patterns 720.

The second redistribution substrate 700 may further include second seed patterns 725. The second seed patterns 725 may be formed on bottom surfaces of the second redistribution patterns 720, respectively. For example, each of the second seed patterns 725 may be provided on bottom and side surfaces of a second via of a corresponding one of the second redistribution patterns 720 and may extend to a bottom surface of the second interconnection line. The second seed patterns 725 may include a material that is the same as or different from the conductive structures 650 and the second redistribution patterns 720. For example, the second seed patterns 725 may be formed of or include a conductive seed material. The second seed patterns 725 may be used as barrier layers, and thus, the second seed patterns 725 may be beneficial to prevent diffusion of a material included in the second redistribution patterns 720, e.g., to the second insulating layers 701 through the second seed patterns 725.

The redistribution pads 750 may be disposed on the upper redistribution patterns 722 and may be coupled (e.g., electrically connected) to the upper redistribution patterns 722, respectively. The redistribution pads 750 may be laterally spaced apart from each other. The redistribution pads 750 may be coupled (e.g., electrically connected) to the conductive structures 650 through the second redistribution patterns 720. Since the second redistribution patterns 720 are provided, the redistribution pads 750 may be provided such that at least one of them is not aligned to (e.g., does not vertically overlap) the conductive structure 650 electrically connected thereto. Accordingly, the disposition of the redistribution pads 750 may be more freely designed.

A lower portion of each of the redistribution pads 750 may be provided in the uppermost one of the second insulating layers 701. An upper portion of each of the redistribution pads 750 may extend to cover at least a portion of a top surface of the uppermost one of the second insulating layers 701. The upper portion of each of the redistribution pads 750 may have a width larger than the lower portion of the redistribution pads 750 in a horizontal direction. The redistribution pads 750 may be formed of or include at least one of metallic materials (e.g., copper).

The second redistribution substrate 700 may further include seed pads 755. The seed pads 755 may be interposed between the upper redistribution patterns 722 and the redistribution pads 750. The seed pads 755 may further extend into regions between the upper redistribution patterns 722 and the uppermost one of the second insulating layers 701. The seed pads 755 may be formed of or include a conductive seed material.

The number of the stacked second redistribution patterns 720 may vary, e.g., depending on embodiments. For example, the upper redistribution pattern 722 may be omitted, and each of the redistribution pads 750 may be disposed on the lower redistribution pattern 721. Alternatively, an intermediate redistribution pattern (not shown) may be further provided between the lower redistribution pattern 721 and the upper redistribution pattern 722. For example, one or more layers of intermediate redistribution patterns may be provided between the lower redistribution pattern 721 and the upper redistribution pattern 722. For example, additional seconding insulating layers 701 corresponding to the intermediate redistribution patterns may also be provided between the lower redistribution pattern 721 and the upper redistribution pattern 722.

The upper package 30 may be disposed on the lower package 20. For example, the upper package 30 may be disposed on the second redistribution substrate 700. The upper package 30 may include an upper substrate 810, an upper semiconductor chip 800, and an upper mold layer 840. The upper substrate 810 may be a printed circuit board or a redistribution layer. Substrate pads 811 may be provided on a top surface of the upper substrate 810.

The upper semiconductor chip 800 may be disposed on the upper substrate 810. The upper semiconductor chip 800 may include integrated circuits, and here, the integrated circuits may include or may be a memory circuit, a logic circuit, or combinations thereof. The upper semiconductor chip 800 may be of a kind different from the first and second semiconductor chips 201 and 202. For example, the upper semiconductor chip 800 may be a memory chip. Upper bumps 850 may be interposed between the upper substrate 810 and the upper semiconductor chip 800 and may be coupled (e.g., contact) to the substrate pads 811 and upper chip pads 830 of the upper semiconductor chip 800. The upper bumps 850 may be formed of or include at least one of solder materials. Unlike that illustrated in the drawings, the upper bumps 850 may be omitted, and the upper semiconductor chip 800 may be directly disposed on (e.g., contact) the upper substrate 810. For example, the upper chip pads 830 may be directly coupled to (e.g., contact) the substrate pads 811. An expression "an element is coupled to the upper substrate 810" may mean that the element is electrically connected to metal lines in the upper substrate 810.

The upper mold layer 840 may be provided on the upper substrate 810 to cover (e.g., surround and/or contact) the upper semiconductor chip 800. The upper mold layer 840 may extend into a gap region between the upper substrate 810 and the upper semiconductor chip 800 to seal or encapsulate the upper bumps 850. In an embodiment, an under-fill layer (not shown) may be further provided in the gap region between the upper substrate 810 and the upper semiconductor chip 800. The upper mold layer 840 may be formed of or include at least one of insulating polymers (e.g., epoxy-based polymers).

The upper package 30 may further include an upper heat-dissipation plate 870. The upper heat-dissipation plate 870 may be disposed on a top surface of the upper semiconductor chip 800 and a top surface of the upper mold layer 840. The upper heat-dissipation plate 870 may include at least one of a heat sink, a heat slug, or a thermal interface material (TIM) layer. In an embodiment, the upper heat-dissipation plate 870 may be formed of or include at least one of metallic materials. Unlike that illustrated in the drawings, the upper heat-dissipation plate 870 may further extend to a side surface of the upper mold layer 840 and/or a side surface of the mold layer 500. In another embodiment, the heat-dissipation plate 870 may be omitted, and the upper mold layer 840 may further cover/contact the top surface of the upper semiconductor chip 800.

The connection bumps 775 may be interposed between the second redistribution substrate 700 and the upper substrate 810 and may be coupled to (e.g., contact) the redistribution pads 750 and the upper substrate 810. Accordingly, the upper package 30 may be electrically connected to the second redistribution substrate 700 through the connection bumps 775. The connection bumps 775 may be formed of or include at least one of solder materials. In certain embodiments, the connection bumps 775 may include or may be metal pillars. An electric connection to the upper package 30 may mean an electric connection to an integrated circuit in the upper semiconductor chip 800.

In another embodiment, the upper substrate 810 and the connection bumps 775 may be omitted, and the upper bumps 850 may be directly coupled to the redistribution pads 750. In this case, the upper mold layer 840 may be in contact with a top surface of the second redistribution substrate 700. In still other example, the upper substrate 810, the connection bumps 775, and the upper bumps 850 may be omitted, and the upper chip pads 830 of the upper semiconductor chip 800 may be directly coupled to the redistribution pads 750.

Figure 6B:
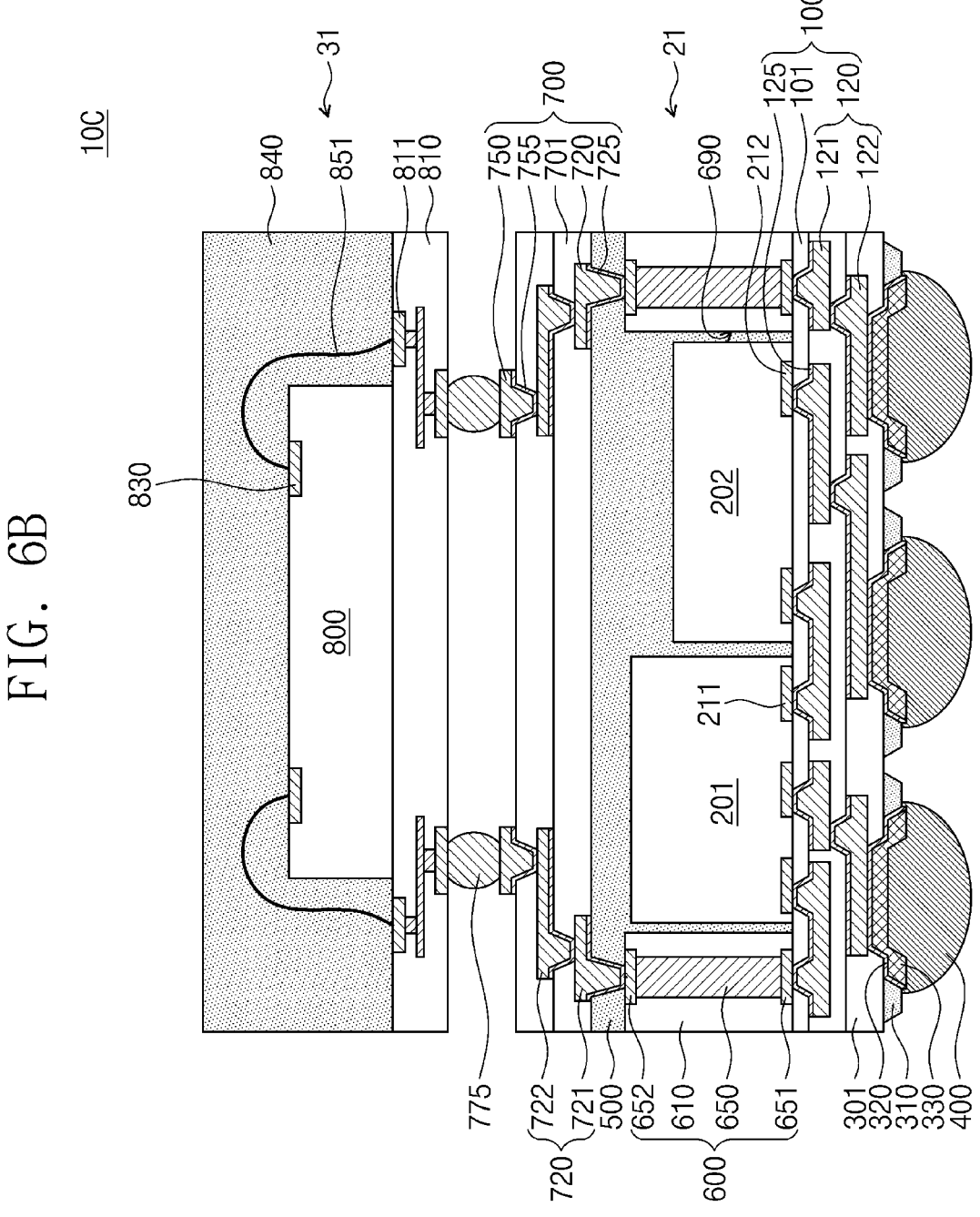
FIG. 6B is a cross-sectional view illustrating a semiconductor package according to an embodiment of the inventive concept.

FIG. 6B is a cross-sectional view illustrating a semiconductor package according to an embodiment of the inventive concept.

Referring to FIG. 6B, a semiconductor package 10C may include a lower package 21, an upper package 31, and the connection bumps 775. The lower package 21 may include the first redistribution substrate 100, the solder balls 400, the protection layer 301, the under-bump protection patterns 310, the under-bump seed patterns 320, the under-bump patterns 330, the first semiconductor chip 201, the second semiconductor chip 202, the conductive structures 650, the second redistribution substrate 700, and a connection substrate 600. The protection layer 301, the under-bump protection patterns 310, the under-bump seed patterns 320, the under-bump patterns 330, and the solder balls 400 may be configured to have substantially the same features as those in the embodiment of FIG. 2.

The connection substrate 600 may be disposed over the redistribution substrate. The connection substrate 600 may have a substrate hole 690, which is formed to penetrate the connection substrate 600. As an example, when the connection substrate 600 is manufactured, the substrate hole 690 may be formed to penetrate a printed circuit board from a top surface to a bottom surface. In a plan view, the substrate hole 690 may be formed in a center portion of the connection substrate 600. The first and second semiconductor chips 201 and 202 may be disposed in the substrate hole 690 of the connection substrate 600. The first and second semiconductor chips 201 and 202 may be disposed to be spaced apart from an inner side surface of the connection substrate 600.

The connection substrate 600 may include a base layer 610, first pads 651, the conductive structures 650, and second pads 652. The base layer 610 may be formed of or include at least one of insulating materials. For example, the base layer 610 may include or be formed of at least one of carbon-based materials, ceramic materials, or polymer materials. The substrate hole 690 may be provided to penetrate the base layer 610. The conductive structures 650 may be provided in the base layer 610. The first pads 651 may be provided on bottom surfaces of the conductive structures 650. The first pads 651 may be exposed to the outside of the connection substrate 600, near/from a bottom surface of the connection substrate 600. The second pads 652 may be disposed on top surfaces of the conductive structures 650.

The second pads 652 may be exposed to the outside of the connection substrate 600, near/from a top surface of the connection substrate 600. The second pads 652 may be electrically connected to the first pads 651 through the conductive structures 650. The conductive structures 650, the first pads 651, and the second pads 652 may be formed of or include at least one of metallic materials (e.g., copper, aluminum, tungsten, titanium, tantalum, and their alloys).

The mold layer 500 may be provided between the first and second semiconductor chips 201 and 202, between the first semiconductor chip 201 and the connection substrate 600, and between the second semiconductor chip 202 and the connection substrate 600. The mold layer 500 may cover/contact top surfaces of the first and second semiconductor chips 201 and 202 and the top surface of the connection substrate 600. In an embodiment, an adhesive insulating film may be attached to the top surface of the connection substrate 600, the top surface of the semiconductor chip 200, and side surfaces of the first and second semiconductor chips 201 and 202 to form the mold layer 500. For example, an Ajinomoto build-up film (ABF) may be used as the adhesive insulating film. As another example, the mold layer 500 may be formed of or include an insulating polymer (e.g., epoxy-based polymer).

The second redistribution substrate 700 may be disposed on the mold layer 500 and the connection substrate 600. The second redistribution substrate 700 may be substantially the same as that in the embodiment of FIG. 6A. However, the lower redistribution pattern 721 may further extend into the mold layer 500 and may be coupled to (e.g., contact and/or electrically connected to) the second pads 652.

The upper package 31 may be disposed on the lower package 21. The upper package 31 may include the upper substrate 810, the upper semiconductor chip 800, and the upper mold layer 840. The upper package 31 may further include the heat-dissipation plate 870 described with reference to FIG. 6A. The upper package 31 and the connection bumps 775 may be configured to have substantially the same features as those in the embodiment of FIG. 6A. However, the upper chip pads 830 may be provided on the top surface of the upper semiconductor chip 800. The upper bumps 850 of FIG. 6A may be omitted. Bonding wires 851 may be provided on the upper chip pads 830 and may be electrically connected to the upper chip pads 830 and the substrate pads 811.

Although not illustrated, the upper package 31 may include the upper bumps 850 of FIG. 6A but may not include the bonding wires 851.

Figure 7:
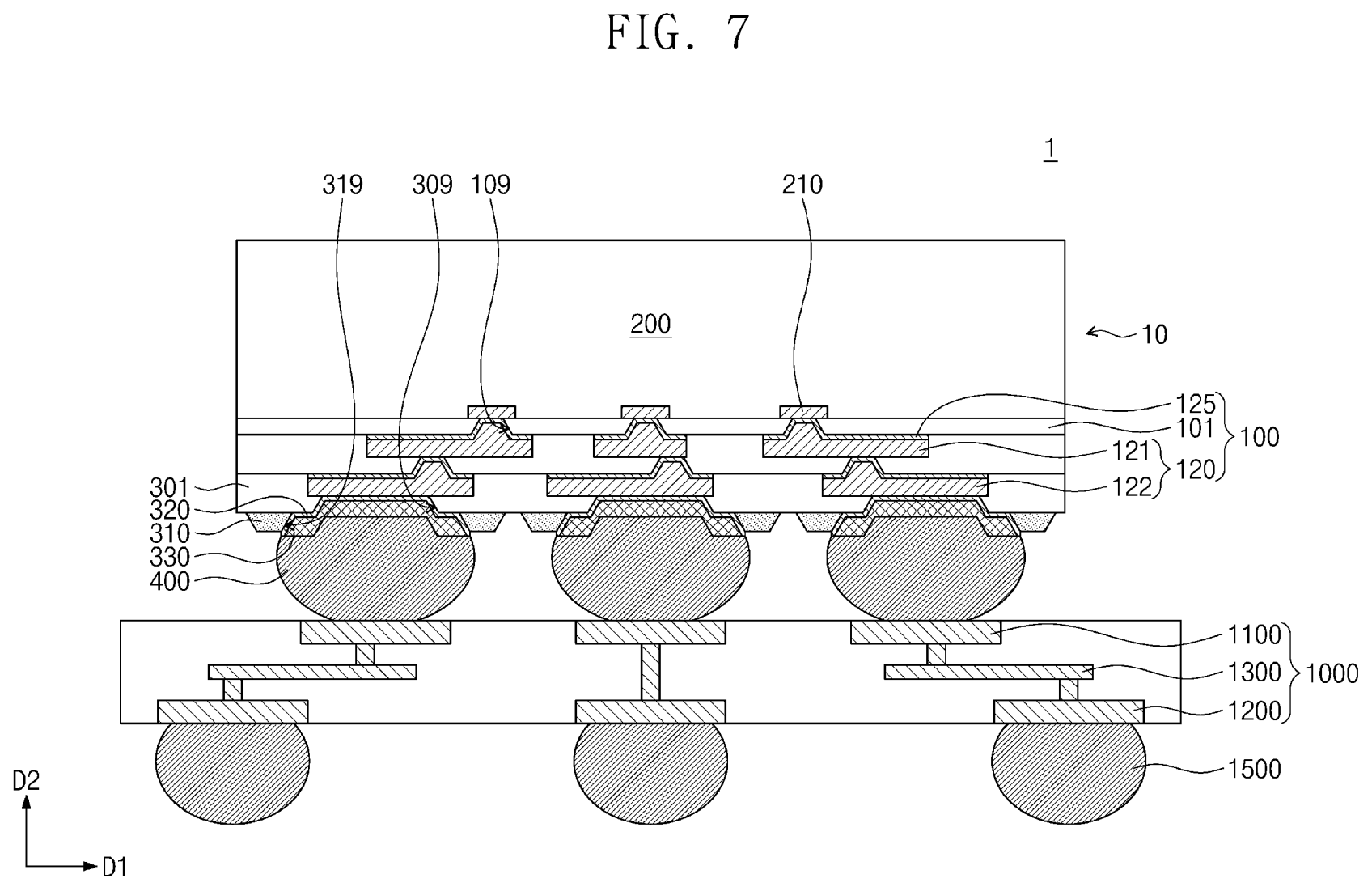

FIG. 7 is a cross-sectional view illustrating a semiconductor module according to an embodiment of the inventive concept. For concise description, a previously described element may be identified by the same reference number without repeating an overlapping description thereof.

Referring to FIG. 7, a semiconductor module 1 may include a board 1000 and the semiconductor package 10. A printed circuit board may be used as the board 1000. The board 1000 may include lower conductive pads 1200, upper conductive pads 1100, and internal lines 1300. The lower conductive pads 1200 and the upper conductive pads 1100 may be provided on bottom and top surfaces, respectively, of the board 1000. The internal lines 1300 may be provided in the board 1000 and may be coupled (e.g., electrically connected) to the upper conductive pads 1100 and the lower conductive pads 1200. The expression "an element is electrically connected to the board 1000" may mean that the element is electrically connected to the internal lines 1300. The semiconductor module 1 may further include outer solder balls 1500. The outer solder balls 1500 may be provided on the lower conductive pads 1200. The lower conductive pads 1200 may have a relatively large pitch, e.g., compared to the upper conductive pads 1100. For example, distances between directly adjacent lower conductive pads 1200 may be greater than distances between directly adjacent upper conductive pads 1100.

The semiconductor package 10 may be mounted on the board 1000. The semiconductor package 10 may be substantially the same as the semiconductor package 10 described in the embodiment of FIG. 2. Alternatively, the semiconductor package 10A of FIG. 5, the semiconductor package 10B of FIG. 6A, or the semiconductor package 10C of FIG. 6B may be mounted on the board 1000.

In an embodiment, the semiconductor package 10 may be disposed on the board 1000 such that the solder balls 400 are aligned to (e.g., contact) the upper conductive pads 1100. A pitch of the solder balls 400 may be substantially equal or similar to a pitch of the upper conductive pads 1100. A soldering process may be performed to connect/adhere the solder balls 400 to the upper conductive pads 1100 and thereby to electrically connect the semiconductor package 10 to the board 1000.

According to an embodiment of the inventive concept, an under-bump protection pattern may be provided on side surfaces of an under-bump pattern and a solder ball. The under-bump protection pattern may prevent a crack issue from occurring between the under-bump pattern and the solder ball and between the under-bump pattern and a protection layer. In addition, it may be beneficial to prevent a short circuit and a leakage current from being formed between the under-bump pattern and the solder ball. A volume of the solder ball may be increased because the under-bump protection pattern may be beneficial for the solder ball material to stay on an under-bump pattern. Accordingly, the under-bump protection pattern may be beneficial to improve reliability and durability of a semiconductor package.

In a method of manufacturing a semiconductor package according to an embodiment of the inventive concept, a height of the under-bump protection pattern may be easily adjusted. Accordingly, the method may be beneficial to improve reliability and durability of a semiconductor package.

Though different figures show variations of exemplary embodiments and different embodiments disclose different features from each other, these figures and embodiments are not necessarily intended to be mutually exclusive from each other. Rather, as recognized from the context of the detailed description above, certain features depicted in different figures and/or described above in different embodiments can be combined with other features from other figures/embodiments to result in additional various embodiments, when taking the figures and related descriptions of embodiments as a whole into consideration. For example, components and/or features of different embodiments described above can be interchangeably combined with corresponding components and/or features of other embodiments unless the context indicates otherwise.

While example embodiments of the inventive concept have been particularly shown and described, it will be understood by one of ordinary skill in the art that variations in form and detail may be made therein without departing from the spirit and scope of the attached claims.

What is claimed is:

1. A method of manufacturing a semiconductor package, comprising:

providing a semiconductor chip;

forming redistribution patterns, which are provided on a top surface of the semiconductor chip and are electrically connected to the semiconductor chip;

forming a protection layer to cover top surfaces of the redistribution patterns;

forming under-bump protection patterns on the protection layer; and forming under-bump patterns, which are provided on the protection layer and are electrically connected to the redistribution patterns, wherein the under-bump protection patterns are spaced apart from each other.

2. The method of claim 1, wherein the under-bump protection patterns are formed to expose at least a portion of a top surface of the protection layer between outer side surfaces of the under-bump protection patterns.

3. The method of claim 1, wherein the under-bump protection patterns have openings exposing the redistribution patterns, and the under-bump patterns are formed in the openings.

4. The method of claim 1, wherein the under-bump protection patterns are formed to have a closed loop shape.

5. The method of claim 1, further comprising forming under-bump seed patterns, wherein the under-bump seed patterns are provided between the under-bump patterns and the under-bump protection patterns, between the under-bump patterns and the protection layer, and between the under-bump patterns and the redistribution patterns.

6. The method of claim 5, wherein the forming of the under-bump seed patterns is performed by a dry etching process.

7. The method of claim 1, wherein the under-bump patterns have:

first top surfaces located on the top surfaces of the redistribution patterns; and second top surfaces located on a top surface of the protection layer, wherein the second top surfaces are provided at a level different from the first top surfaces.

8. The method of claim 7, further comprising forming solder balls on the under-bump patterns, wherein the solder balls cover the first and second top surfaces of the under-bump patterns.

9. The method of claim 1, wherein top surfaces of the under-bump patterns are formed at a level lower than top surfaces of the under-bump protection patterns.

10. The method of claim 1, wherein a height of the under-bump patterns ranges from 5 μm to 30 μm.

11. The method of claim 1, wherein a height of the under-bump protection patterns ranges from 3 μm to 100 μm.

12. The method of claim 1, wherein the under-bump protection patterns comprise a photo-imageable insulating material.

13. A method of manufacturing a semiconductor package, comprising:

providing a semiconductor chip including a chip pad;

forming a redistribution substrate, which includes an insulating layer, a seed pattern, and redistribution patterns, on a top surface of the semiconductor chip, the redistribution patterns being electrically connected to the chip pad;

forming a protection layer to cover top surfaces of the redistribution patterns;

forming under-bump protection patterns, each of which has a closed loop shape with an opening, on the protection layer, the under-bump protection patterns exposing at least a portion of a top surface of the protection layer between outer side surfaces of the under-bump protection patterns;

forming an under-bump seed layer on the protection layer and the under-bump protection patterns to cover the top surface of the protection layer, top surfaces of the under-bump protection patterns, and bottom and side surfaces of the openings;

forming under-bump patterns, which are electrically connected to the redistribution patterns, in the openings of the under-bump protection patterns;

etching the under-bump seed layer to form under-bump seed patterns, which are provided between the under-bump patterns and the under-bump protection patterns, between the under-bump patterns and the protection layer, and between the under-bump patterns and the redistribution patterns; and forming solder balls on the under-bump patterns, wherein the under-bump protection patterns are spaced apart from each other.

14. The method of claim 13, wherein the under-bump patterns have:

first top surfaces located on the top surfaces of the redistribution patterns; and second top surfaces located on the top surface of the protection layer, wherein the second top surfaces are located at a level different from the first top surfaces.

15. The method of claim 13, wherein top surfaces of the under-bump patterns are provided at a level lower than top surfaces of the under-bump protection patterns.

16. The method of claim 13, wherein the etching of the under-bump seed layer is performed in a dry etching manner.

17. A semiconductor package, comprising:

a semiconductor chip;

redistribution patterns, which are provided on a bottom surface of the semiconductor chip and are electrically connected to the semiconductor chip;

a protection layer covering bottom surfaces of the redistribution patterns;

under-bump protection patterns, which are provided on a bottom surface of the protection layer and have a closed loop shape; and under-bump patterns electrically connected to the redistribution patterns, in the under-bump protection patterns and on the protection layer, wherein the under-bump protection patterns are spaced apart from each other.

18. The semiconductor package of claim 17, wherein the under-bump protection patterns are provided to expose at least a portion of the bottom surface of the protection layer between outer side surfaces of the under-bump protection patterns.

19. The semiconductor package of claim 17, wherein the under-bump patterns have:

first bottom surfaces located on the bottom surfaces of the redistribution patterns; and second bottom surfaces located on a bottom surface of the protection layer, wherein the second bottom surfaces are provided at a level different from the first bottom surfaces.

20. The semiconductor package of claim 17, further comprising under-bump seed patterns, wherein the under-bump seed patterns are provided between the under-bump patterns and the under-bump protection patterns, between the under-bump patterns and the protection layer, and between the under-bump patterns and the redistribution patterns.

* * * * *